United States Patent [19]
Takahashi et al.

[11] Patent Number: 5,618,739
[45] Date of Patent: Apr. 8, 1997

[54] METHOD OF MAKING LIGHT VALVE DEVICE USING SEMICONDUCTIVE COMPOSITE SUBSTRATE

[75] Inventors: Kunihiro Takahashi; Yoshikazu Kojima; Hiroaki Takasu; Nobuyoshi Matsuyama; Hitoshi Niwa; Tomoyuki Yoshino; Tsuneo Yamazaki, all of Tokyo, Japan

[73] Assignee: Seiko Instruments Inc., Japan

[21] Appl. No.: 459,834

[22] Filed: Jun. 2, 1995

Related U.S. Application Data

[62] Division of Ser. No. 264,635, Jun. 23, 1994, Pat. No. 5,486,708, which is a continuation of Ser. No. 791,912, Nov. 13, 1991, Pat. No. 5,347,154.

[30] Foreign Application Priority Data

| Nov. 15, 1990 | [JP] | Japan | 2-309437 |
| Jan. 23, 1991 | [JP] | Japan | 3-6501 |
| Feb. 16, 1991 | [JP] | Japan | 3-22420 |
| Apr. 11, 1991 | [JP] | Japan | 3-79330 |
| Apr. 11, 1991 | [JP] | Japan | 3-79337 |

[51] Int. Cl.⁶ .................................. H01L 21/84
[52] U.S. Cl. .................... 438/158; 438/458; 438/164; 438/459
[58] Field of Search .............. 437/2, 21, 40 TFI, 437/41 TFI, 974, 86; 148/DIG. 12, DIG. 135

[56] References Cited

U.S. PATENT DOCUMENTS

| 4,024,626 | 5/1977 | Leupp et al. | 29/571 |
| 4,759,610 | 7/1988 | Yanagisawa | 350/334 |
| 4,771,016 | 9/1988 | Bajor et al. | 437/974 |
| 4,838,654 | 6/1989 | Hamaguchi et al. | 350/333 |
| 4,885,616 | 12/1989 | Ohta | 357/23.7 |

(List continued on next page.)

FOREIGN PATENT DOCUMENTS

| 0164646 | 12/1985 | European Pat. Off. | 357/23.7 |
| 0211402 | 2/1987 | European Pat. Off. | 359/59 |
| 271544 | 10/1978 | Germany. | |
| 134283 | 2/1979 | Germany. | |
| 57-167655 | 10/1982 | Japan. | |

(List continued on next page.)

OTHER PUBLICATIONS

S. Takahashi, et al., IEEE Conf. Proc. '90, p. 147, ". . . SOI Devices Obtained by Device Transfer Method" 1990.
K. Sumiyoshi, et al., IEDM '89, p. 165, "Device Layer Transferred Poly Si TFT Array for HRLC Projector" 1989.
IBM Tech. Discl. Bulletin, 28(5) (1985) 1855, "Methods of Producing Single Crystal Silicon on Silicon Dioxide" Oct. 1, 1985.

(List continued on next page.)

*Primary Examiner*—Charles L. Bowers, Jr.
*Assistant Examiner*—Leon Radomsky
*Attorney, Agent, or Firm*—Adams & Wilks

[57] ABSTRACT

A process for manufacturing a semiconductor device comprises forming an SOI substrate by depositing an insulating film of silicon dioxide on a surface of a temporary silicon substrate, thermally bonding a semiconductor substrate of single crystal silicon on a surface of the insulating film, and polishing the semiconductor substrate to form a single crystal semiconductor thin film. A semiconductor integrated circuit is then formed in the single crystal semiconductor thin film. Thereafter, a support substrate is fixedly adhered in face-to-face relation to a surface of the semiconductor integrated circuit opposite to the temporary substrate. The temporary substrate is then removed to expose a surface of the insulating film. The exposed surface of the insulating film is then subjected to a treatment including at least forming an electrode.

13 Claims, 19 Drawing Sheets

U.S. PATENT DOCUMENTS

| | | | |
|---|---|---|---|
| 4,906,587 | 3/1990 | Blake | 437/41 |
| 4,968,638 | 11/1990 | Wright et al. | 437/41 |
| 4,980,308 | 12/1990 | Hayashi et al. | 437/86 |
| 4,984,033 | 1/1991 | Ishizu et al. | 357/17 |
| 5,110,748 | 5/1992 | Sarma | 437/974 |
| 5,206,749 | 4/1993 | Zavracky et al. | 257/347 |
| 5,256,562 | 10/1993 | Vu et al. | 437/974 |
| 5,455,187 | 10/1995 | Richards et al. | 437/974 |

FOREIGN PATENT DOCUMENTS

| | | | |
|---|---|---|---|
| 59-126639 | 7/1984 | Japan | 357/23.7 |
| 59-224165 | 12/1984 | Japan | 357/23.7 |
| 60-1243666 | 7/1985 | Japan | 359/59 |
| 62-5661 | 1/1987 | Japan | 357/4 |
| 63-55529 | 3/1988 | Japan . | |
| 63-90859 | 4/1988 | Japan . | |
| 63-101831 | 5/1988 | Japan | 340/784 |
| 1-38727 | 2/1989 | Japan . | |
| 149257 | 2/1989 | Japan | 359/59 |
| 2-154232 | 6/1990 | Japan . | |
| 0149257 | 6/1990 | Japan | 257/347 |
| 2154232 | 6/1990 | Japan | 359/62 |
| 319370 | 1/1991 | Japan | 357/23.7 |
| 2206445 | 1/1989 | United Kingdom . | |

OTHER PUBLICATIONS

A. Yamada et al., Electroncis Lett., 23(1) (1987) 39, "SOI by Wafer Bonding with SOG as adhesive" Jan. 2, 1987.

IEEE Transactions On Electron Devices, vol. 37, No. 1, Jan. 1990, pp. 121–127, "A Laser–Recrystallization . . . LCD's".

Japanese Journal of Applied Physics, vol. 29, No. 4, part 2, Apr. 1990, pp. L521–L523, "Experimental Fabrication . . . Silicon Films".

Fujitsu Scientific and Technical Journal, vol. 24, No. 4+index, Dec. 1988, pp. 408–417, "SOI–Device on Bonded Wafer".

Journal of the Electromechanical Society, vol. 120, No. 11, Nov. 1973, pp. 1563–1566, "Thin Silicon Film on Insulating Substrate".

METHOD OF MAKING LIGHT VALVE DEVICE USING SEMICONDUCTIVE COMPOSITE SUBSTRATE

This is a division of application Ser. No. 08/264,635 filed Jun. 23, 1994, now U.S. Pat. No. 5,486,708 which is a continuation of Ser. No. 07/791,912, filed Nov. 13, 1991, now U.S. Pat. No. 5,347,154.

BACKGROUND OF THE INVENTION

1. Field of the Invention

The present invention relates to a semiconductor device and a process for manufacturing the same and, more particularly, to a semiconductor substrate having a structure composed of a thin film laminated layer intensively formed with transistor elements and a light valve device having said semiconductor substrate, a liquid crystal layer and an opposed substrate integrated with one another.

2. Description of the Prior Art

In an active matrix device of the prior art, thin film transistors are formed on the surface of an amorphous silicon thin film or a polycrystalline silicon thin film deposited over a glass substrate. The amorphous silicon thin film and the polycrystalline silicon thin film can be easily deposited over the glass substrate by the chemical vapor deposition so that the structure is suited for manufacturing an active matrix liquid crystal display device having a relatively large frame. The transistor elements formed over the amorphous or polycrystalline silicon thin film are generally of the field effect insulated gate type. At present, an active matrix liquid crystal display device using amorphous silicon having an area of about 3 inches to 10 inches is commercially produced. The amorphous silicon thin film is suited for a liquid crystal panel having a large area because it can be formed at a low temperature equal to or less than 350° C. On the other hand, the active matrix liquid crystal display device using the polycrystalline silicon film having a small-sized liquid crystal display panel as wide as about 2 inches is commercially produced at present.

However, the active matrix liquid crystal display device using the amorphous silicon thin film or the polycrystalline silicon thin film of the prior art is suited for a direct view type display device requiring a relatively large frame image plane but is not always suited for miniaturizing the device size and increasing the density of the pixels. In recent years, there has been a growing demand for a microminiature display device or a light valve device having fine and highly dense pixels. This microminiaturized light valve device is utilized as the primary image forming plane of a projection type image device, for example, so that it can be applied to a projection type high-definition TV system. The fine semiconductor manufacturing technology can be used to manufacture a microminiature light valve device which has a pixel size on the order of 10 μm and a total size of about several cm.

However, when the amorphous or polycrystalline silicon thin film of the prior art is used, the transistor elements on the order of sub-microns cannot be formed by applying the fine semiconductor processing technology. Since the amorphous silicon thin film, for example, has a mobility of about 1 $cm^2/Vsec$, a driver circuit having the required high speed operation cannot be formed over a common substrate. In case of the polycrystalline silicon thin film, on the other hand, the crystal particle has a size of about several μm, thus creating a problem with regards to the miniaturization of active elements.

On the other hand, the semiconductor device widely utilized has its transistor elements formed on the surface of a single crystal substrate. FIG. 2 is a section showing a semiconductor substrate. Generally speaking, the semiconductor substrate is formed of a single crystal semiconductor substrate 101 made of silicon.

Specifically, the single crystal semiconductor substrate 101 has its surface formed integrally and highly densely with the transistor elements or the like by the impurity diffusion and the film forming process. In the example shown in FIG. 2, the single crystal semiconductor substrate 101 is formed thereover with an insulated gate field effect transistor. The element region to be formed with the transistor is enclosed by a field insulated film 102. The element region is formed with a source region 103 and a drain region 104 by the impurity doping process. Between these source region 103 and drain region 104, there is formed a region 105 for forming The channel of the transistor. This channel forming region 105 is arranged thereover through a gate oxide film 106 with a gate electrode 107. The transistor element composed of those gate electrode 107, the source region 103, the drain region 104 and so on is covered with an inter-layer insulating film 108. Through contract holes formed in the inter-layer insulating film 108, there are arranged a source electrode 109 and a drain electrode 110 for wiring the individual transistors.

The semiconductor substrate made of the silicon single crystal of the prior art, as described above, is superior, having a high speed operation and high density of the transistor elements and so on, to the aforementioned amorphous silicon thin film and polycrystalline silicon thin film.

Since, however, the silicon single crystal substrate is opaque, it cannot be applied as it is to a device such as a light valve device requiring transparency of the substrate.

In recent years, on the other hand, an image projection system has been developed using the light valve device of that kind. This image projection system is desired to have a smaller size, less weight and a finer projection image. To accomplish this, a very high density integrated circuit of the semiconductor device used in the light valve device is required.

Incidentally, the semiconductor device of the prior art is formed with the transistor elements by subjecting one face of the single crystal semiconductor substrate 101 sequentially to the impurity doping process and the film forming process. These processes are always carried out from one face only so that the films are sequentially laminated. As a result, once the lower layer is processed and laminated by an upper layer, it cannot be subjected to an additional treatment any more, thus raising a problem that the step design is restricted in various points.

Although the semiconductor substrate 101 has a surface and back opposed to each other, the semiconductor device is formed by making use of the surface of the semiconductor substrate 101 only. Thus, the wiring of an integrated circuit is concentrated only at the surface while leaving the back unused. As a result, the useable area restricts the wiring density raising a problem in that a far higher density of the integrated circuit cannot be obtained. If the back of the semiconductor substrate could be utilized as the wiring face, the integration density could be effectively doubled. Nevertheless, this two-face wiring has been impossible in the structure of the prior art. In order to raise the integration density, it has also been proposed to wire multiple layers on one face of the semiconductor substrate. With these multi-wiring operations, however, the flatness of the semiconductor substrate surface is degraded resulting in an open defect in step portions or other short-circuit defects.

In the structure of the prior art, the transistor elements are directly integrated on the surface of the single crystal semiconductor substrate. As a result, this single crystal semiconductor substrate is in an integral relation with the transistor elements formed thereover. In other words, the integrated circuit is always supported by the single crystal semiconductor substrate. Depending upon the intended use of the semiconductor device, however, the use of the single crystal semiconductor substrate as the support substrate is frequently improper. Since this support substrate cannot be freely set, the existing structure restrictively limits the flexibility available in the application of the semiconductor device.

SUMMARY OF THE INVENTION

In view of the aforementioned various prior art, the present invention has an object to provide a semiconductor device, in which a single crystal semiconductor thin film has its two faces processed to make a double-side wiring possible. In accordance with the present invention, the single crystal semiconductor thin film is adhered through an insulating film to a support substrate made of the same material as that of said semiconductor single crystal to form electrodes and various elements over said single crystal semiconductor thin film and by subquently removing said support substrate to also form electrodes and so on over said insulating film to.

Another object of the present invention is to provide a highly densified semiconductor device which is enabled to perform stable operations without any influence from a light by forming an insulating film internally in the depthwise direction of a single crystal semiconductor substrate by forming a group of various elements on the surface of said single crystal semiconductor substrate, by subsequently removing the ground of said single crystal semiconductor substrate to expose said insulating film to the outside and by forming electrodes and a shielding film over said exposed insulating film.

Another object of the present invention is to enable the kind of the support substrate to be freely selected by laminating a substrate either of an adhesive or through an adhesive layer fixedly onto the surface of the single crystal semiconductor formed with the aforementioned element group.

Still another object of the present invention is to provide a light valve device which is enabled to display a very fine image of high resolution by forming a transparent insulating support substrate as a substrate over a single crystal semiconductor surface formed with said elements.

A further object of the present invention is to provide a light valve device which is enabled to prevent any optical leakage of the transistor element on said single crystal semiconductor thin film by forming a shielding film on that surface of an insulating film, which is opposed with respect to a channel region to the side of said transistor element formed with a gate electrode.

The other objects and features of the present invention will be described in detail in the following in connection with the embodiments thereof.

BRIEF DESCRIPTION OF THE DRAWINGS

FIG. 21(a) is a top plan view showing a layout of a semiconductor substrate; FIG. 21(b) is a section showing a composite substrate using said semiconductor substrate; FIG. 21(c) is an enlarged explanatory view showing a portion of a pixel region; and FIG. 21(d) is a section showing the light valve device;

DETAILED DESCRIPTION OF THE PREFERRED EMBODIMENTS

Figure 1:
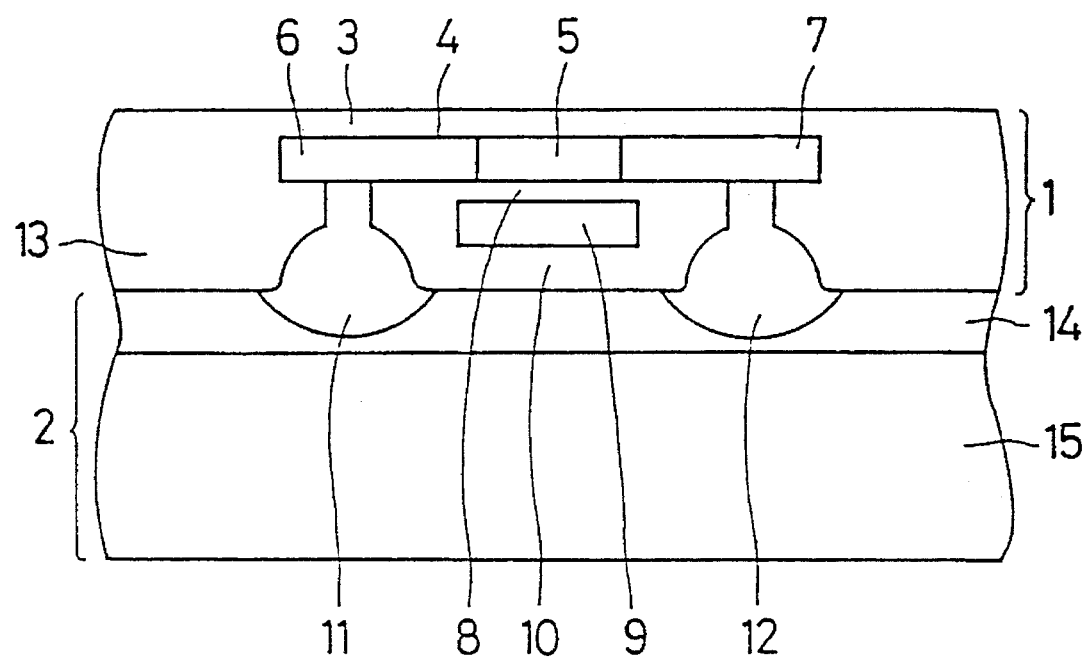
FIG. 1 is a schematic section showing a portion of a basic structure of a semiconductor device according to the present invention.
Figure 2:
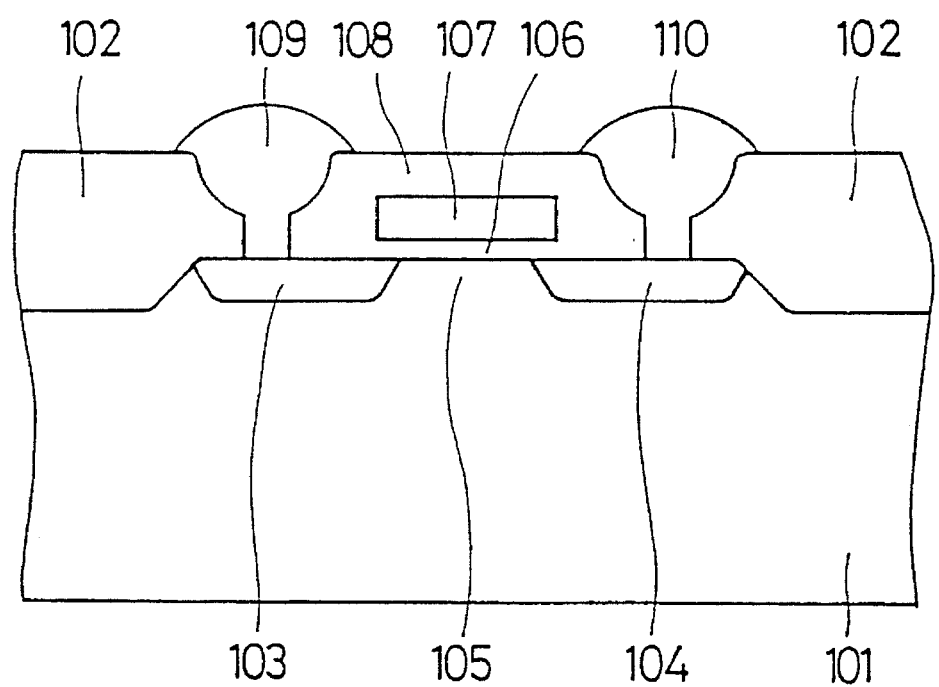
FIG. 2 is a schematic section showing a portion of one example of the semiconductor device of the prior art.

FIG. 1 is a section showing a portion of a basic structure of a semiconductor device according to the present invention. As shown, a semiconductor device according to the present invention is composed of a thin film laminated layer 1 formed integrally with transistor elements and a support layer 2 for supporting the thin film laminated layer 1. This Thin film laminated layer 1 has a surface insulating film 3 having a flag face to be formed with electrodes. Below this surface insulating film 3, there is arranged a single crystal semiconductor thin film 4. This single crystal semiconductor thin film 4 is formed not only with a channel forming region 5 for each transistor element but also with a source region 6 and a drain region 7 which merge into the channel forming region 5. Below the single crystal semiconductor thin film 4, there is arranged through a gate oxide layer 8 an intermediate electrode film which forms a gate electrode 9 of the transistor element. Below said intermediate electrode film, moreover, there is arranged a back layer film 10. This back layer film 10 is formed with con,act holes which extend to the source region 6 and the drain region 7 so that a source electrode 11 and a drain electrode 12 are arranged therethrough. These source electrode 11 and drain electrode 12 are wired all over one face of the back layer film 10. Incidentally, this back layer film 10 is composed of a field insulating layer 13 surrounding an element region to be formed with the transistor element and an insulating layer covering the gate electrode 9. The thin film laminated layer 1 thus far described is supported by the support layer 2. In other words, this support layer 2 is fixedly adhered face-to-face to the back layer film 10.

Preferably, said support layer 2 has a two-layer structure composed of an adhesive film 14 applied to the back layer film 10 and a support substrate 15 fixedly adhered in face-to-face by the adhesive film 14. Alternatively, the support layer 2 may have a single-layer structure molded of an adhesive. The adhesive to be used for this fixed face adhesion can be a fluid material composed mainly of silicon dioxide, for example. The support substrate 15 may be formed in advance with through holes for releasing the gas which is generated during a heat treatment of the adhesive. Moreover, the material for the support substrate 15 may be freely selected from an optically transparent material such as quartz in addition to the semiconductor such as silicon.

Each of the transistor elements formed integrally in the thin film laminated layer 1 has the source region 6 and the drain region 7, which are formed in the single crystal semiconductor thin film 4 in self-alignment with the gate electrode 9. The surface insulating film 3 positioned over the single crystal semiconductor thin film 4 and formed with the channel forming region 5, the source region 6 and the drain region 7 has a flat face so that it can be freely formed, if necessary, with a variety of electrodes. For example, a capacity element can be formed in the surface insulating film 3, by forming an opposed electrode over the surface insulating film 3 such that it is opposed to the drain region 7. Then, it is possible to manufacture a semiconductor device having a DRAM structure. Alternatively, a transparent electrode can be so formed over said surface insulating film 3 that it is electrically connected with the drain region 7 to form a pixel. The semiconductor device having such structure can be applied as a drive substrate for a light valve. Through the contact holes formed to extend through the surface insulating film 3, furthermore, there may be formed over the surface insulating film 3 a wiring electrode which is connected with the terminal portion of each transistor element. Then, the wiring of the integrated circuit can be accomplished on the two faces of the thin film laminated layer 1 to improve the effective wiring density. Alternatively, a optical leakage preventing shielding film can be formed over said surface insulating film 3 so as to cover at least the channel forming region 5 of each transistor element formed in the single crystal semiconductor thin film 4. Moreover, an additional gate electrode can be formed over said surface insulating film 3 such that it is aligned with the channel forming region 5 of each transistor element formed in the single crystal semiconductor thin film 4. The performance of the transistor can be improved by controlling the channel forming region 5 by a pair of opposed gate electrodes. Furthermore, a pad electrode for external connection can be formed over the surface insulating film 3. Since this pad electrode has a relatively large area, the packaging density of the integrated circuit can be substantially improved by separating it from the wiring line of the integrated circuit at the back and arranging it on the surface.

The channel forming region 5 formed in the single crystal semiconductor thin film 4 can be processed from the side of the surface insulating film 3. By doping the channel forming region 5 selectively with an impurity through the surface insulating film 3, for example, the conductivity of the channel forming region 5 can be see individually and selectively. Thus, it is possible to provide the semiconductor device having an MROM structure.

Figure 15A:
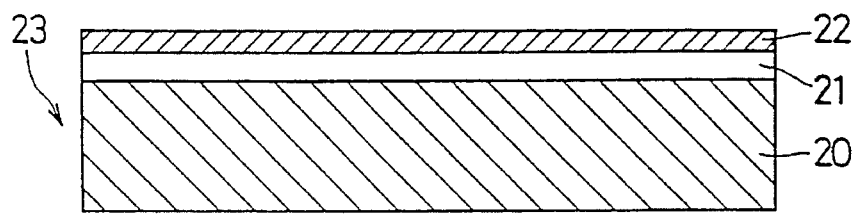
FIGS. 15(a) to 15(c) are process diagrams for explaining a process for manufacturing a semiconductor device of a tenth embodiment according to the present invention.
Figure 15B:
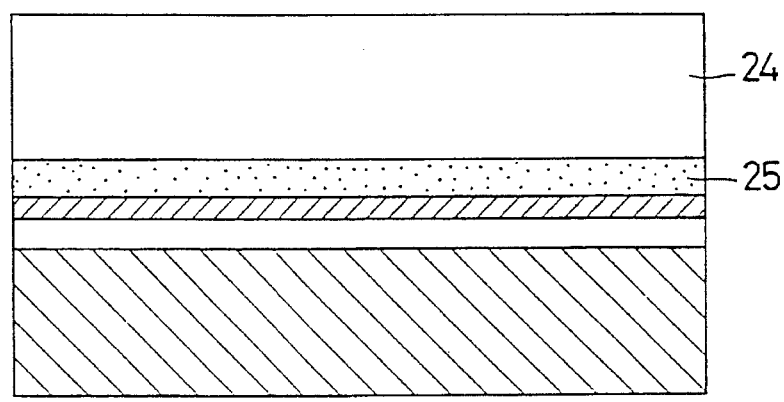
Figure 15C:
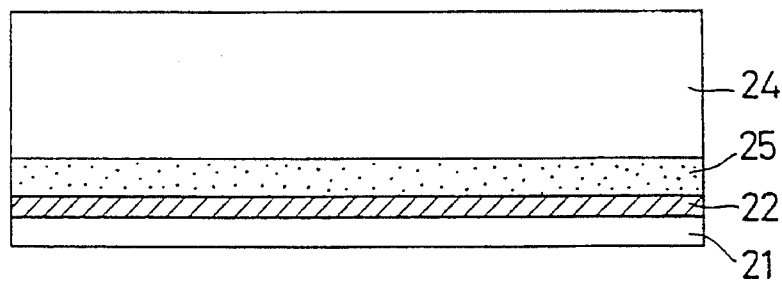

Next, a process for manufacturing the semiconductor device having the basic structure shown in FIG. 1 will be described with reference to FIGS. 15(a) to 15(c). First of all, a first step is performed (as shown in FIG. 15(a)) for forming an SOI substrate 23 which has a single crystal semiconductor thin film 22 laminated over a tentative substrate 20 through an insulating film 21. Next, a second seep is performed for forming a semiconductor integrated circuit with respect go said single crystal semiconductor thin film 22. Subsequently, a third seep is performed (as shown in FIG. 15(b)) for fixedly adhering a support substrate in face-to-face relation through an adhesive layer 25 to the surface of the formed integrated circuit at the side opposed to said tentative substrate 20. Moreover, a fourth seep is performed (as shown in FIG. 15(c)) for removing said tentative substrate 20 to expose the flat insulating film 21 to the outside. Finally, a fifth step is performed for forming an electrode at lease on the exposed flat surface of the insulating film.

Preferably at said first step, the semiconductor substrate made of single crystal silicon is thermally bonded at first to the tentative substrate of silicon through the insulating film of silicon dioxide. After this, said semiconductor substrate is polished and thinned to form the SOI substrate. For forming the insulating film, a silicon nitride film may be deposited at first as a surfacing treatment on the tentative silicon substrate, and then the silicon dioxide layer may be deposited by the CVD. This CVD silicon dioxide layer is excellent in adhesiveness to the semiconductor substrate so that the semiconductor substrate can be thermally bonded in a fixed manner. The silicon nitride layer thus deposited as the surfacing treatment performs as an etching stopper at a later step. At the aforementioned fourth step, the tentative substrate can be etched off by using the silicon nitride layer as the etching stopper. As a result, a flat insulating film is exposed to the outside.

The aforementioned third step is performed by fixedly adhering the support substrate in face-to-face relation to the surface of the semiconductor integrated circuit by using a fluid adhesive composed mainly of silicon dioxide, for example. Alternatively, much adhesive may be fed to the surface of the semiconductor integrated circuit and solidified to form the support substrate having a single-layer structure.

In the semiconductor device according to the present invention, transistor elements are integrally formed in the thin film laminated layer. This thin film laminated layer has its back formed with a wiring pattern for The transistor elements and its surface flattened and exposed to the outside. As a result, a variety of electrodes can be formed suitably and additionally according to the design specifications on the exposed flat surface. The so-called "double-side wiring" can be accomplished to densify The integration of the semiconductor device The channel forming region of each transistor element is formed in the single crystal semiconductor thin film, which is covered with the surface insulating film. Through this surface insulating film, there can be accomplished additional processes upon the single crystal semiconductor thin film. The so-called "double side treatment" can be accomplished to increase the degree of freedom for step designing of the semiconductor manufacture process. To the back of the thin film laminated layer, the support substrate is fixedly adhered in face-to-face relation through the adhesive film. As a result, the material for and the shape of the support substrate can be freely selected in accordance with the design specifications.

The semiconductor device having such many advantages can be manufactured by making use of the SOI substrate. First of all, the ordinary semiconductor manufacturing process is applied to the SOI substrate to form a group of thin film transistor elements. The support substrate is fixedly adhered in face-to-face relation by an adhesive to that surface of the SOI substrate, which is formed with such element group. After this, the tentative substrate portion of the SOI substrate is removed to expose the flat insulating film face to the outside. Thus, the grouped thin film transistor elements can be transferred from the SOI substrate to the support substrate to provide a semiconductor device which can be easily subjected to the double-side treatment and wiring process.

By using the SOI substrate, like the case of the single crystal silicon wafer of the prior art, the LSI manufacturing technology can be utilized to form remarkably fine thin film transistor elements. The SOI substrate is structured, as has been described hereinbefore, such that the single crystal semiconductor thin film made of silicon is laminated on the tentative substrate through the insulating film. This single crystal semiconductor thin film is superior in the physical characteristics to the polycrystalline silicon thin film or the amorphous silicon thin film so that it is suited for the LSI manufacture. Since the polycrystalline silicon thin film, if used, has a crystal particle size of several μm, it necessarily restricts the fine structure of the thin film transistor elements. In addition, the polycrystalline silicon thin film has a film forming temperature of about 600° C. and makes it difficult to exploit the miniaturizing technology or LSI manufacture technology requiring a high-temperature process of 1,000° C. or more. On the other hand, if the amorphous silicon thin film is used, it requires a film forming temperature of about 300° C. and makes it impossible to use a high-temperature treatment required for the LSI manufacture technology. On the contrary, the single crystal semiconductor thin film is excellent in crystal uniformity and thermally stable so that it can be freely treated at a high temperature to form fine single crystal thin film transistor elements. Since, moreover, the single crystal silicon thin film has a higher charge mobility than the polycrystalline silicon thin film or amorphous silicon thin film, it is possible to provide transistor elements which are excellent in high-speed responsiveness.

Figure 3:
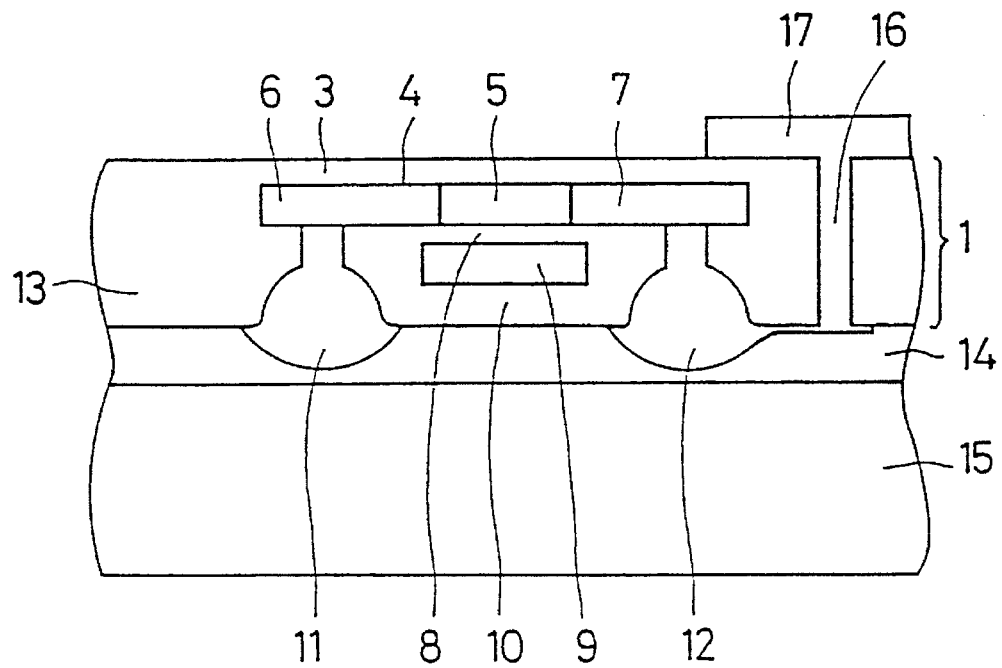
FIG. 3 is a schematic section showing a portion of a first embodiment of the semiconductor device according to the present invention, in which a pad electrode is formed on the face opposed to a wiring pattern.

Next, a first preferred embodiment of the present invention will be described in detail in the following. FIG. 3 shows the embodiment, in which an integrated circuit wiring and an externally connecting pad electrode are separately formed on the upper and lower two faces. As shown, the thin film laminated layer 1 is formed with each of an insulated gate field effect transistor elements. This transistor element has its channel forming region 5, source region 6 and drain region 7 formed in the common single crystal silicon thin film 4. This single crystal silicon thin film 4 is covered with the surface insulating film 3 having a flat face. Below the channel forming region 5, there is arranged through the gate oxide film 8 the gate electrode 9. Below this gate electrode 9, there is formed the back layer film 10. This back layer film 10 is made of an inter-layer insulating film for covering and protecting the gate electrode 9. Moreover, the field insulating film 13 is formed to surround the transistor element. The back layer film 10 is formed with contact holes, through which are formed the source electrode 11 connected with the source region 6 and the drain electrode 12 connected with the drain region 7. These source electrode 11 and drain electrode 12 are wired in accordance with a predetermined pattern to connect the individual transistor elements along one face of the back layer film 10. To one face of the back layer film 10, there is fixedly adhered in face-to-face relation through the adhesive film 14 the support substrate 15 which supports the thin film laminated layer 1.

The thin film laminated layer 1 is partially formed with a through hole 16. This through hole 16 can be formed by etching the field insulated film 13 selectively. The surface insulating film 3 is formed thereover with a pad electrode 17 for connecting the drain electrode 12 electrically through the through hole 16. The pad electrode 17 is provided for electric connection between the semiconductor device and an external circuit and is wire-bonded, for example. For this purpose, the pad electrode is given a size of about 100 μm square far larger than that of the transistor element. Thus, the pad electrode occupying an especially large area is separated from the back wiring of the integrated circuit and formed on the surface so that the area of the back can be effectively exploited. Moreover, the pad electrode can be firmly formed by vacuum-evaporating metal aluminum over the surface insulating film 3 which is remarkably excellent in flatness. As a result, it is possible to perform a highly reliable wiring bonding.

Figure 4A:
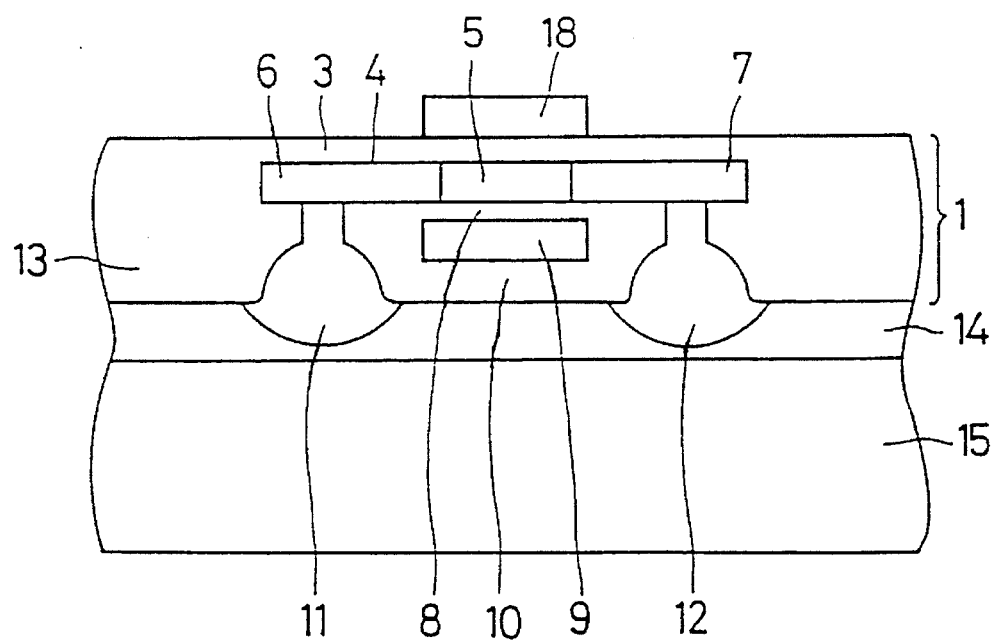
FIG. 4(a) is a schematic section showing a portion of a second embodiment of the semiconductor device according to the present invention, in which gate electrodes are arranged at the two sides of a channel forming region.

FIG. 4(a) shows a second embodiment of the semiconductor device according to the present invention. The same components as those of the embodiment shown in FIG. 3 are designated by the identical reference numerals so that they can be easily understood. In the present embodiment, a additional gate electrode 18 is added to the gate electrode 9 which is formed previously. The additional gate electrode 18 is patterned over the surface insulating film 3 in alignment with the channel forming region 5 which is formed in the single crystal silicon thin film 4. As a result, the channel forming region 5 has its conductivity controlled downwardly and upwardly by the paired gate electrodes 9 and 18. With this structure, the transistor element has its threshold voltage determined substantially only by the material characteristics of the single crystal silicon thin film 4 but hardly by the influences of other size or shape factors so that the dispersion of electro-characteristics is reduced. By controlling the conductivity of the channel forming region simultaneously upwardly and downwardly, moreover, the ON/OFF characteristics of the transistor element can be remarkably improved to establish a high current. Unlike the prior art in which the gate electrode is formed only at one side, the back channel can be effectively prevented to improve the transistor characteristics. Accordingly, the channel length of the channel forming region can be miniaturized to an order of sub-micron, as compared with the prior art.

In the present invention, after the thin film transistor elements have been formed by using the SOI substrate, they are transferred to the support substrate 15 to provide the semiconductor device. As a result of this transfer, unlike the prior art, the gate electrode 9 is positioned below the channel forming region 5, which has its upper side opened for an additional processing. Thanks to this structure, the additional gate electrode 18 can be remarkably easily formed.

As has been described hereinbefore, the present invention uses the SOI substrate to form the transistor elements for the single crystal silicon thin film. The single crystal silicon thin film is superior in the miniaturization and the high-speed responsiveness to the polycrystalline silicon thin film or the amorphous silicon thin film but is defective in that a higher optical leakage current will flow into the channel forming region. This optical leakage current increases the offset current of the transistor elements thereby to deteriorate the ON/OFF characteristics. In order to prevent establishment of that optical leakage current, the additional gate electrode 18 may preferably be exemplified by a shielding film having shielding characteristics. For example, after the metal aluminum has been deposited all over the flat face of the surface insulating film 3, a predetermined patterning is performed to form the additional gate electrode 18 so that an effective shielding film can be formed.

Figure 4B:
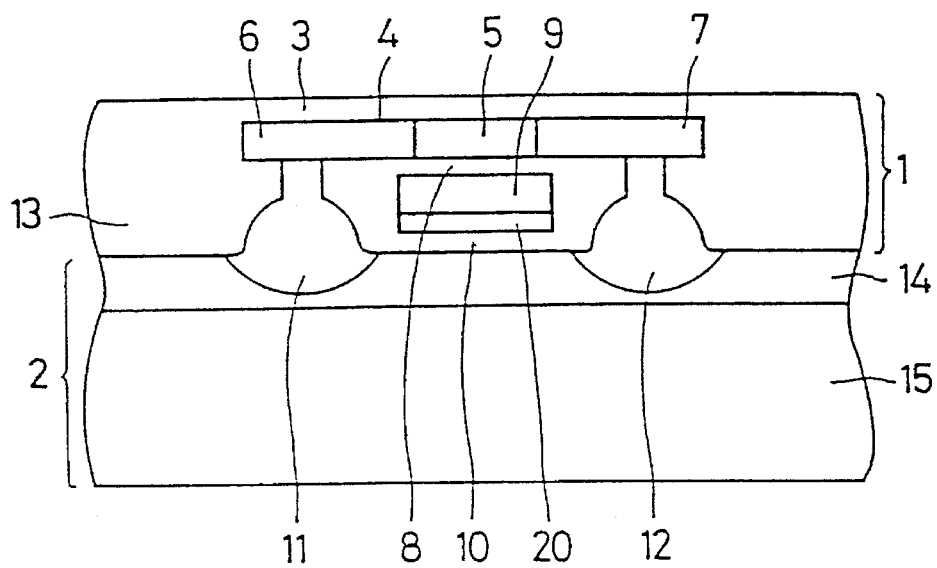
FIG. 4(b) is a schematic section showing a portion of a third embodiment of semiconductor device according to the present invention, in which a shielding layer is formed on a gate electrode at the side of a support substrate.

FIG. 4(b) shows a third embodiment of the semiconductor device according to the present invention. The same components as those of the embodiment shown in FIG. 1 are designated by the identical reference numerals so that they can be easily understood. In the present embodiment, a support substrate 15 is transparent. In the case of the second embodiment shown in FIG. 4(a) wherein a light shielding layer is formed on a insulating film 3 with a opaque support substrate 15, scattered light scattered from the surface of the support substrate 15 will be incident on the gate electrode 9 from the underside direction.

It is preferable for stable operation of a transistor element on a single crystal semiconductive layer that a gate electrode 9 contacted with a gate oxide layer 8 is made out of a polycrystalline layer. A polycrystalline thin film layer has characteristics of light transparency so that a light shielding layer 20 has to be formed on the gate electrode 9 to prevent a light from the underside of the gate electrode 9. The materials for the light shielding layer 20 be used Cr, Ta, W and other metals. In case of a electric conductive thin film used for the light shielding layer 20, the light shielding layer has the same function as a gate electrode. The materials for the light shielding layer 20 can be semiconductive or insulative materials such as a silicon germanium, nitrade or others.

Figure 5:
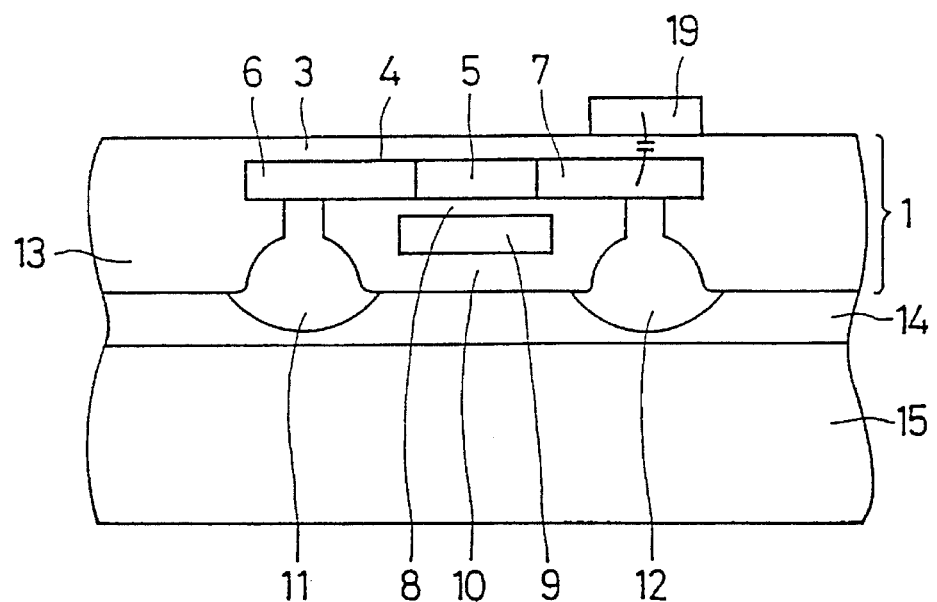
FIG. 5 is a schematic section showing a portion of a fourth embodiment of the semiconductor device according to the present invention and shows an example of a DRAM structure.

FIG. 5 shows a fourth embodiment of the semiconductor device according to the present invention. Likewise, the same components as those of the preceding embodiments are designated by the identical reference numerals so that the present embodiment may be easily understood. The present embodiment relates to the semiconductor device having the so-called "DRAM structure". As shown, an opposed electrode 19 is patterned and formed over the surface insulating film 3 such that it is opposed to the drain region 7 of each transistor element formed in the single crystal silicon thin film 4. Between the drain region 7 and the opposed electrode 19, there is interposed a dielectric layer which is made of the surface insulating film 3 to constitute a capacity element. In other words, the data storing capacity elements are coupled to the individual integrated transistor elements to form a DRAM. According to the present invention, this DRAM can be easily produced by patterning the opposed electrodes simply with respect to the flat face of the surface insulating film 3. After a voltage has been applied to the gate electrode 9 to render the channel forming region 5 conductive, charge is fed from the source region 6 to the drain region 7 to render the channel forming region 5 non-conductive. As a result, the supplied charge is temporarily stored as the stored data in the capacity elements. In this way, the data are written. In order to read out the written data, the channel forming region 5 may be rendered conductive again so that the charge once stored may be introduced into the source region 6 to have its quantity detected.

Figure 6:
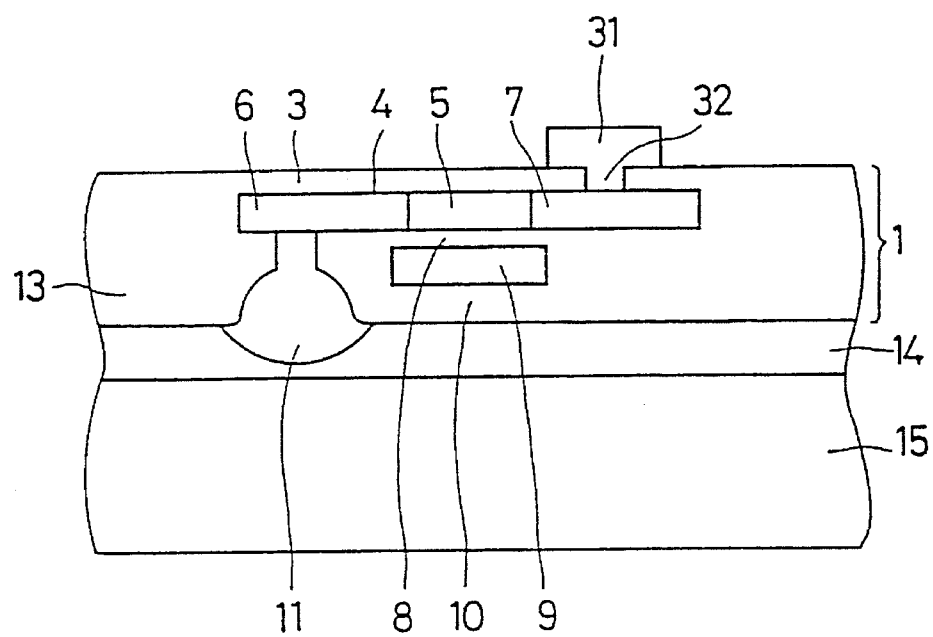
FIG. 6 is a schematic section showing a portion of a fifth embodiment of the semiconductor device according to the present invention, in which a wiring pattern of a semiconductor integrated circuit is divided into those of two upper and lower faces.

FIG. 6 shows a fifth embodiment of the semiconductor device according to the present invention. In the present embodiment, the terminal electrode of the transistor element, i.e., one of the source electrode and the drain electrode is formed not on the back but on the surface. Thus, the wiring density on each face can be improved by dividing the wiring of the transistor element vertically of the thin film laminated layer 1. In case only one face is formed with the source electrode and the drain electrode, as in the prior art, the miniaturization of the transistor elements is impeded. In the present embodiment, the wiring line of the source electrode 11 is guided to the back, whereas a drain electrode 31 is formed on the surface through a contact hole 32 which is opened in the surface insulating film 3. As has been described above, the semiconductor device according to the present invention is provided by transferring the thin film transistor element from the SOI substrate the support substrate so that the drain region 7 formed in the single crystal silicon thin film 4 is positioned on the surface through the surface insulating film 3. As a result, the electrode connection can be easily established through the surface insulating film 3. Thus, the double-face bonding of the integrated circuit can be accomplished to increase the capacity more than the prior art.

Figure 7:
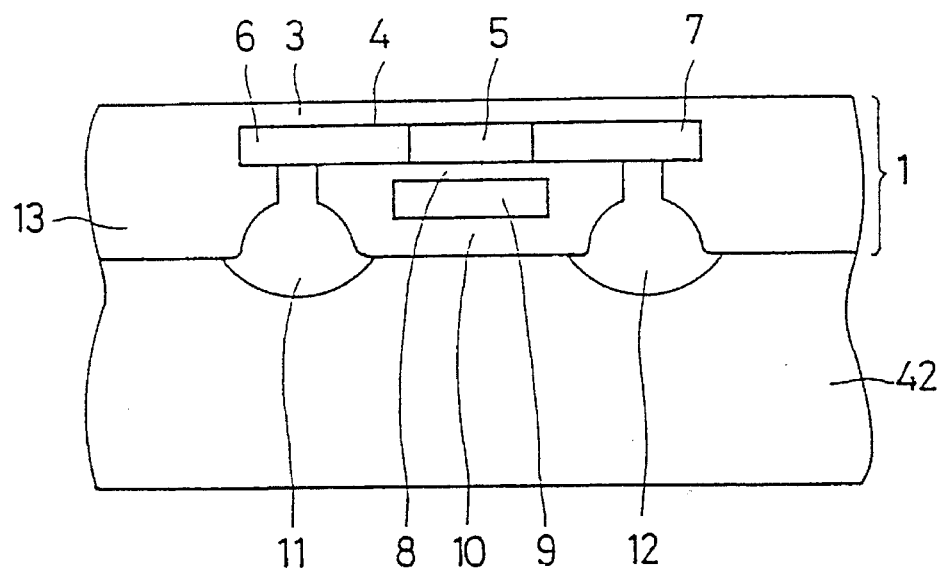
FIG. 7 is a schematic section showing a portion of a sixth embodiment of the semiconductor device according to the present invention, in which a support substrate has a single-layer structure.

FIG. 7 shows a sixth embodiment of the semiconductor device according to the present invention. Unlike the foregoing embodiments, the present embodiment uses a support layer 42 having a single-layer structure. This support layer 42 can be molded by feeding and solidifying much adhesive to the back of the thin film laminated layer 1, which is formed with the semiconductor integrated circuit. Since, unlike the foregoing embodiments, the present embodiment need not use a separate support substrate, it is possible to reduce the production cost and to reduce the overall thickness of the semiconductor device. Since the semiconductor device having such structure is formed into a sheet, it is suitably packaged in an IC card, for example.

Figure 8:
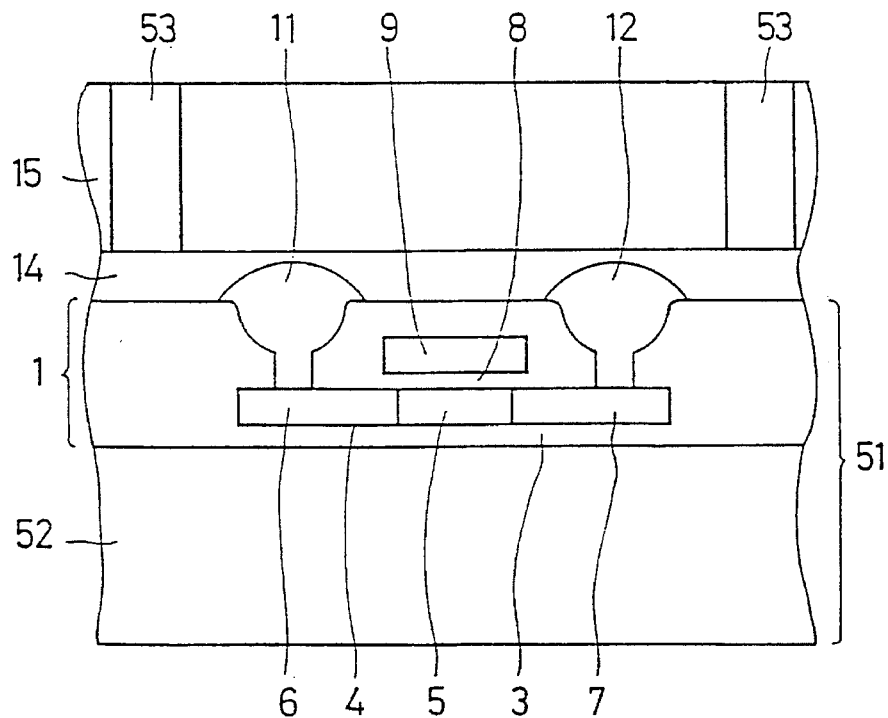
FIG. 8 is a schematic section showing a portion of a seventh embodiment of the semiconductor device according to the present invention, in which a support substrate is formed with degasifying holes.

FIG. 8 is a section showing a portion of a seventh embodiment of the semiconductor device according to the present invention. FIG. 8 is inverted upside-down from the foregoing Figures so that the present embodiment can be easily understood. Moreover, FIG. 8 shows the state of a half-product so that the present embodiment may be easily understood. In the half-product state, as shown, an SOI substrate 51 is left. This SOI substrate 51 is composed of the thin film laminated layer 1 formed with the grouped transistor elements and a tentative substrate 52 supporting the thin film laminated layer 1 tentatively through the insulating film 3. On the tentative substrate 52, there is deposited through the insulating film 3 the single crystal silicon thin film 4. This single crystal silicon thin film is formed with the channel forming region 5, the source region 6 and the drain region 7 of each transistor element. On the SOI substrate 51 formed integrally with the grouped transistor elements, there is fixedly adhered in face-to-face relation through the adhesive layer 14 the support substrate 15. This support substrate 15 is formed in advance with through holes 53 at a predetermined pitch. These through holes 53 are provided for releasing the gas which is produced during the heat treatment of the adhesive film 14. Without such through holes, the gas produced in the course of thermally setting the adhesive film 14 would have no way of escape to make it difficult to adhere the uniform and rigid support substrate 15 fixedly in the face-to-face relation. If the produced gas is confined in the adhesive film 14 to form bubbles, it deteriorates the reliability of the semiconductor device. In order to eliminate this disadvantage, therefore, the degasifying through holes 15 are formed in advance in the support substrate 15 in accordance with the present embodiment. After the support substrate has been fixedly adhered in the face-to-face relation by using the adhesive film 14, the tentative substrate 52 composing the SOI substrate 51 is polished and etched off to expose the flat insulating film 3 to the outside.

Figure 9:
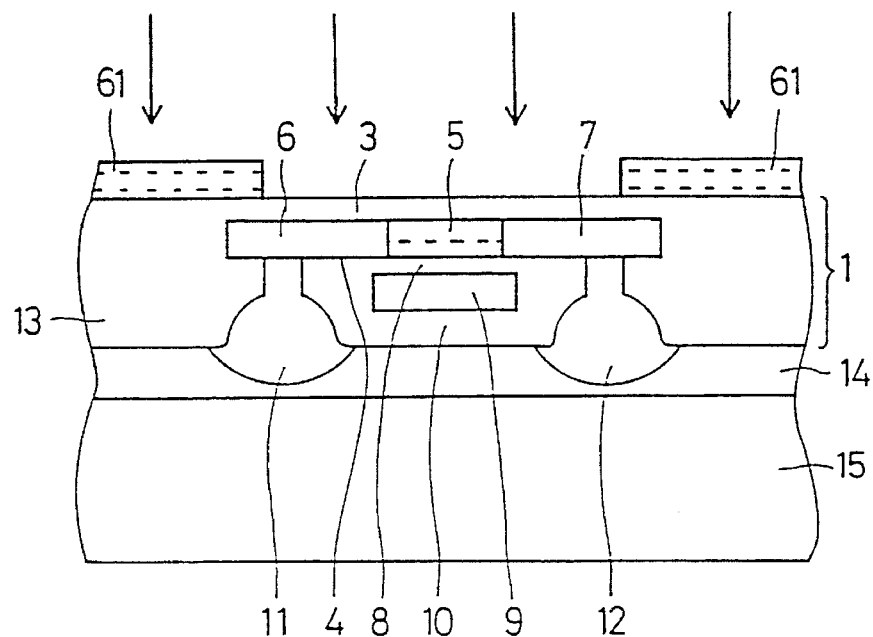
FIG. 9 is a schematic section showing a portion of an eight embodiment of the semiconductor device according to the present invention and shows an MROM structure.

FIG. 9 is a section showing a portion of a eighth embodiment of the semiconductor device according to the present invention. The present embodiment relates to the so-called "MROM structure". In this MROM, i.e, mask ROM, the data are written in the individual channel forming regions of the transistor elements which are integrally formed in an array shape. The data are written by setting the conductivity of the channel forming region selectively. In the present invention, as shown, after the transistor elements have been integrally formed over the SOI substrate, the semiconductor device is transferred to the support substrate 15. Unlike the semiconductor device of the prior art, therefore, the gate electrode 9 is laid under the channel forming region 5 formed in the single crystal silicon thin film 4. The channel forming region 5 has its upper face opened. With such structure, the conductivity of the channel forming region 5 can be selectively set and controlled from the surface side. Specifically, a resist film 61 is patterned over the surface insulating film 3 in accordance with the data pattern to be stored. As a result, the element regions of the individual transistor elements are selectively masked. If the surface of the semiconductor device is implanted with ions all over its surface, only the element regions unmasked are selectively doped with the impurity ions to increase the conductivity of the channel forming region 5. Thus, the data are written in the transistor element array. For reading out the data, a potential difference to be established between the source electrode 11 and the drain electrode 12 may be detected by applying a predetermined voltage to the gate electrode 9.

According to the present embodiment, the data writing operation is carried out at the final stage of the semiconductor device manufacturing process. This makes it possible to manufacture a great number of half-products in advance before they are written with the data. A remarkably efficient manufacture control can be accomplished by finally writing the data according to the specifications required.

Figure 10:
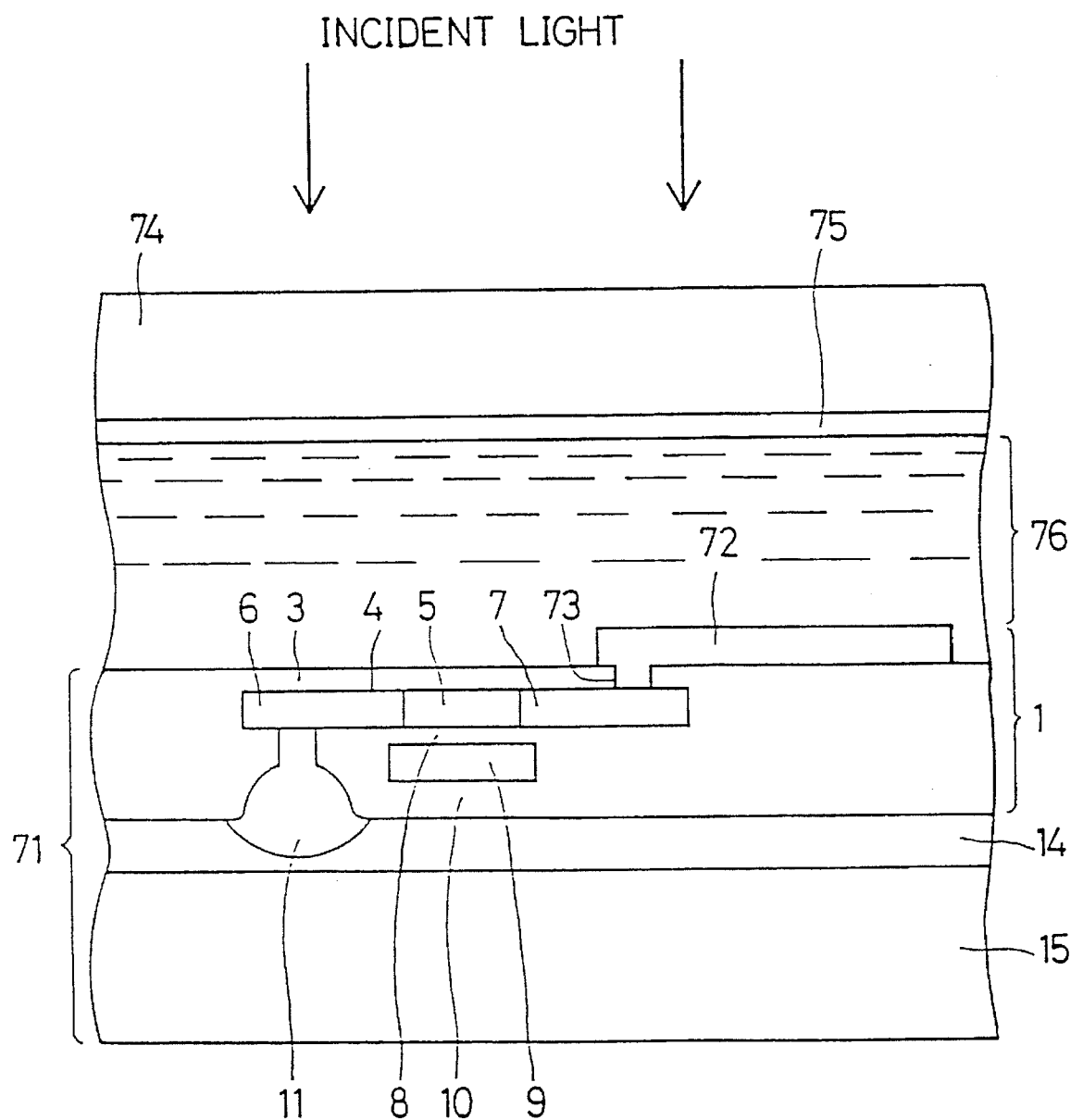
FIG. 10 is a schematic section showing a portion of a ninth embodiment of the semiconductor device according to the present invention and shows an example of a semiconductor device used as a light valve driving substrate.

FIG. 10 is a schematic section showing a portion of an ninth embodiment of the semiconductor device according to the present invention. The present embodiment relates to a semiconductor device to be used as a light valve substrate. A light valve substrate 71 made of the semiconductor device is composed of, as shown, the thin film laminated layer 1 formed integrally with the grouped transistor elements, the transparent support substrate 15, and the adhesive film 14 for adhering the former two fixedly in face-to-face relation. Each transistor element is made of an insulated gate field effect transistor and is composed of the channel forming region 5, the source region 6, the drain region 7, and the gate electrode arranged below the channel forming region 5 through the gate oxide film 8. The surface insulating film 3 is arranged to cover the single crystal silicon thin film 4. The surface insulating film 3 has a remarkably flat surface. This flat surface is arranged with transparent electrodes 72 for constituting pixels in a manner to correspond to the individual transistor elements. Each transparent electrode 72 is electrically connected with the drain region of the corresponding transistor element through a contact hole 73 opened in the surface insulating film 3. The transistor element functions, as a switch for the transparent electrode 72, not only to apply a predetermined voltage to the gate electrode 9 to render the channel forming region 5 conductive but also to apply a predetermined drive voltage to the source electrode 11 to drive the transparent electrode 72. This transparent electrode 72 is formed over the remarkably flat surface insulating film 3 so that it has excellent smoothness and dimensional accuracy. The transparent electrode 72 and the thin film laminated layer 1 formed with a corresponding transistor element or switching element are supported by the transparent support substrate 15 through the adhesive film 14. In case The semiconductor device is used as the light valve device, it has to be optically transparent so that it may control the transparency of an incident light. In the present embodiment, therefore, the support substrate 15 is made of a transparent material such as glass, and the adhesive film 14 is also made of a transparent material. Accordingly, the laminated structure composed of the transparent electrode 72, the adhesive film 14 and the transparent support substrate 15 is transparent as a whole so that it can achieve the light valve function for each pixel.

Figure 11:
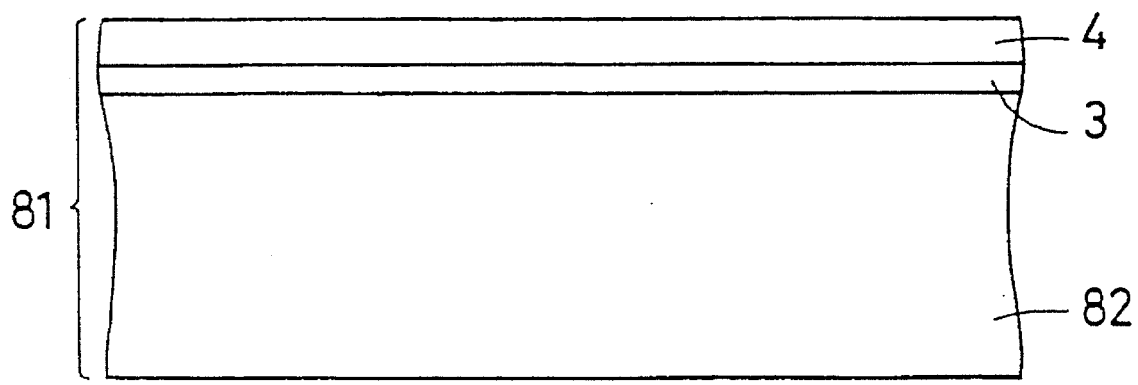
FIG. 11 is a process diagram for explaining a first step of a process for manufacturing a semiconductor device according to the present invention.

An opposed substrate 74 is arranged at a predetermined gap and opposite to the light valve substrate 71 having such structure. The opposed substrate 74 is made of a glass material and has its inner surface formed with a common electrode 75. The gap between the light valve substrate 71 and the opposed substrate 74 is filled up with an electrooptical substance such as a liquid crystal layer 76 for modulating an incident light optically for each pixel. Specifically, the transparency to the incident light is varied to effect the light valve function in accordance with the level of the drive voltage which is applied between the transparent electrode 72 forming the pixel and the common electrode 75. In case the liquid crystal layer 76 is used as the electrooptical substance layer, its thickness has to be controlled to a remarkably uniform thickness so that a uniform light valve function may be achieved. Since, in this case, the surface insulating film 3 positioned in the uppermost portion of the light valve substrate 71 have a remarkably flat face, it is easy to attain a uniform thickness. In addition, an orientation is required when the liquid crystal layer 76 is used. This orientation can be uniform because the light valve substrate 71 has an exceptionally smooth surface, Next, the process for manufacturing a semiconductor device according to a tenth embodiment of the present invention will be described in detail in the following with reference to FIGS. 11 to 14. FIG. 11 is a process diagram showing a first step of the semiconductor device manufacturing process. At this step, an SOI substrate 81 is prepared at first. This SOI substrate 81 has the single crystal semiconductor thin film 4 which is laminated on a temporary or tentative substrate 82 through the insulating film 3.

The SOI substrate 81 having such structure can be prepared by depositing a polycrystalline silicon thin film on the surface of the tentative substrate 82 made of an insulating or semiconductor substance by chemical vapor growth, and subsequently by heating it with laser beam irradiation so that the polycrystalline film may be recrystallized into a single crystal structure. Generally speaking, however, the single crystal obtained by the recrystalization of a polycrystal does not always have a uniform crystal orientation but has a relatively high lattice defect density. For these reasons, the application of the miniaturizing technology or the LSI manufacture technology as in the silicon wafer to the SOI substrate prepared by the recrystalization method is restricted to some extent. In the present embodiment, therefore the single crystal silicon thin film 4 having a uniform crystal orientation and a lattice defect of low density like those of the silicon wafer used widely in the semiconductor manufacture process is formed over the tentative substrate 82. This method will be specifically described in the following.

First of all, the single crystal silicon plate and the tentative substrate 82 are prepared. This tentative substrate 82 is made of a silicon material, for example. On the other hand, the single crystal silicon plate may be exemplified by a high quality silicon wafer used in the LSI manufacture, for example, and has a crystal orientation of a uniformity in a range of (100) 0.0 ±1.0 and a single crystal lattice defect density of 500/cm$^2$ or less. This single crystal silicon plate has its back flattened. On the other hand, the surface of the tentative substrate 82 is formed with the insulating film 3. This insulating film 3 is prepared by depositing silicon dioxide by chemical vapor growth or CVD, for example. Incidentally, a silicon nitride layer may preferably be deposited as the surfacing treatment on the surface of the tentative substrate 82 before the silicon dioxide layer is deposited by the CVD. The insulating film 3 thus deposited also has a flat face.

Next, the single crystal silicon plate having the flat face and the tentative substrate 82 are thermally bonded by superposing and heating them through the insulating film 3. At this time, those two plate members are thermally bonded through the excellently adhesive insulating film 3 made of silicon dioxide so that they are fixedly bonded to each other.

Subsequently, the surface of the single crystal silicon plate is polished. As a result, the insulating film 3 is formed thereover with the single crystal silicon thin film 4 which is polished to a desired thickness. Thus, as shown in FIG. 11, there is obtained the SOI substrate 81 which is composed of the tentative substrate 82 of silicon and the single crystal silicon thin film 4. Incidentally, the polishing treatment for thinning the single crystal silicon plate may be replaced by the etching treatment. Since the single crystal silicon thin film 4 thus obtained retains the quality of the silicon wafer substantially as it is, it is possible to obtain a semiconductor substrate material which is extremely excellent in the uniformity of the crystal orientation and the density of the lattice defect.

Figure 12:
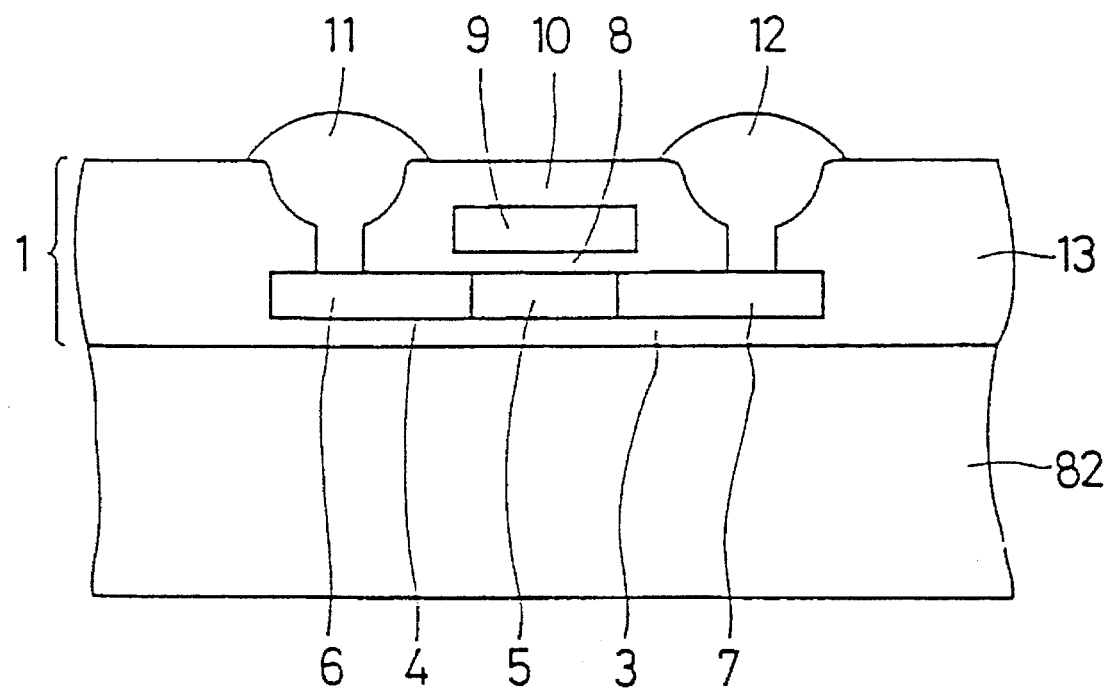
FIG. 12 is a process diagram for explaining a second step of the process for manufacturing the semiconductor device according to the present invention.

Next, a second step of the semiconductor device manufacturing process according to the present invention will be described in the following with reference to FIG. 12. At this seep, the single crystal silicon thin film 4 is formed with the semiconductor integrated circuit to form the thin film laminated layer 1. Specifically, the single crystal silicon thin film 4 is selectively thermally oxidized at first so that it is converted into the field insulating layer 13 while leaving individual element regions. As a result, the element regions are shaped such that they are surrounded by the field insulating layer 13. Subsequently, the element region surface is thermally oxidized to form the gate insulating film 8. An intermediate electrode film is deposited on the gate insulating film 8 and is subjected to a predetermined patterning to form the gate electrode 9.

In a case of the third embodiment of the present invention shown in FIG. 4(b), the intermediate electrode film has a stacked structure comprising a gate electrode and a light shielding layer. In this case, the intermediate electrode film having both a gate electrode film and a light shielding film are processed as a gate electrode 9 after this step. Then, the gate electrode 9 is used as a mask to dope the single crystal silicon thin film 4 with an impurity to form the source region 6 and the drain region 7 by the ion implantation. As a result, the source region 6 and the drain region 7 are formed in self-alignment with the gate electrode 9. The channel forming region 5 left undoped is formed between the doped source region 6 and drain region 7. After the end of the ion implantation, the element regions are covered all over the surface with the passivation film 10. Then, the contact hole is opened in the passivation film 10 to form the source electrode to be connected with the source region 6 and the drain electrode connected with the drain region 7. As a result, the passivation film 10 and the field insulating layer 13 have their surface wired with the integrated circuit composed of the grouped transistor elements. Simultaneously with this, the gate electrode 9 is also wired.

Figure 13:
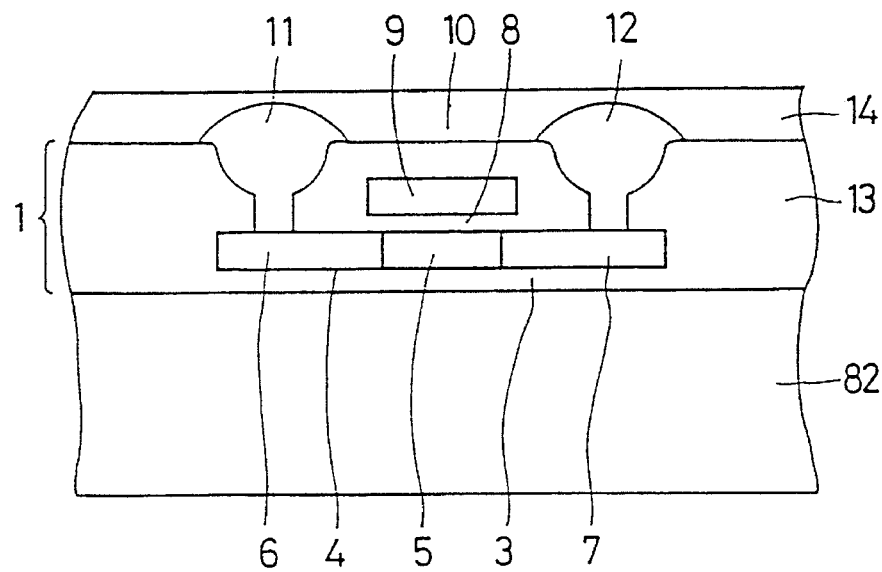
FIG. 13 is a process diagram for explaining a third step of a process for manufacturing a semiconductor device according to the present invention.

Next, a third step of the semiconductor device manufacturing process according to the present invention will be described in the following with reference to FIG. 13. At this third step, a support substrate is fixedly adhered in a face-to-face relation to the opposite side of the tentative substrate 82. For this, an adhesive is applied at first to the surface of the thin film laminated layer 1 formed with the semiconductor integrated circuit, to form the adhesive layer 14. A material to be used for the adhesive can be exemplified by a polyimide resin or an epoxy resin. The polyimide resin is excellent in heat resistance and in little content of an impurity. On the other hand the epoxy resin is excellent in workability and in adhesion. Nevertheless, those organic materials have highly different coefficients of linear expansion than that of the silicon material and may raise a problem in reliability in dependence upon the application of the semiconductor device. Moreover, those organic materials necessarily contain alkali ions and may adversely affect the reliability of the semiconductor device. In the present embodiment, therefore, the adhesive used is a fluid inorganic material having a composition, in which silicon dioxide particle is dispersed in a solvent. Such silicon dioxide adhesive can be subjected to a heat treatment to form a denser silicon dioxide film. This silicon dioxide film not only is excellent in reliability, because it contains few alkali ions, but also can reduce the thermal stress because its coefficient of linear expansion is as high as that of the substrate material. The silicon dioxide adhesive can be applied to the surface of the integrated circuit by a simple method such as the spinner, dipping or spraying method. Thanks to the fluidity, the silicon dioxide adhesive is excellent in step smoothness.

Figure 14:
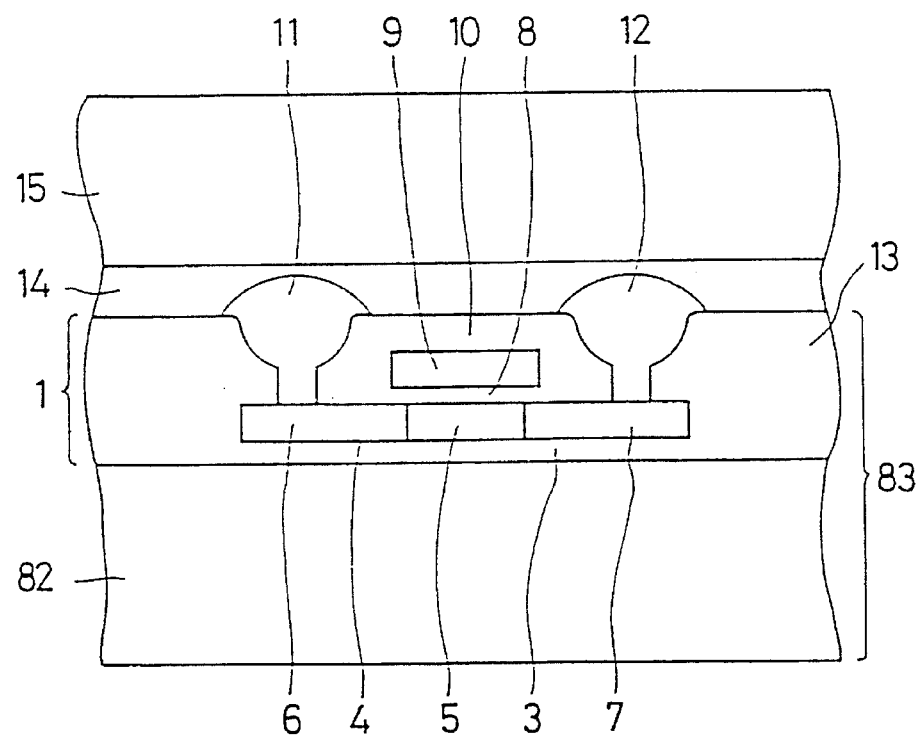
FIG. 14 is a process diagram for explaining third and fourth steps of the process for manufacturing the semiconductor device according to the present invention.

At a step shown in FIG. 14, moreover, the support substrate 15 is adhered to the surface of the applied adhesive film 14. The material for the support substrate 15 can be suitably selected in accordance with the application of the semiconductor device. For example, silicon or quartz may be selected as the material. By heat treatment in this state, the solvent contained in the adhesive film 14 is evaporated away, and the fusion of the silicon dioxide particle advances until the support substrate 15 and the SOI substrate 81 are rigidly adhered to each other in face-to-face relation. The adhesive film 14 thus heated forms a dense silicon dioxide film having a quality substantially identical to that of a thermally oxidized film. Incidentally, the solvent contained in the adhesive is inorganic or organic. The organic solvent is suited for the case, in which an especially thick adhesive film is to be formed. If this thickness is increased to a considerable extent, the support substrate can be constructed of the adhesive film itself. In this case, the completed semiconductor device takes a sheet shape and can be applied to an especially thin device.

Finally, with the support substrate 15 and the SOI substrate 81 being adhered, the tentative substrate 82 is removed to expose the insulating film 3 having the flat face to the outside. This removal is carried out by etching the tentative substrate 82 of silicon, for example. At this time, the interface between the insulating film 3 and the tentative substrate 82 is formed as the surfacing treatment with a silicon nitride layer so that the silicon nitride layer effectively functions as the etching stopper. Specifically, due to the difference in the etching rate between the silicon and the silicon nitride, the etching removal of the tentative substrate 82 of silicon substantially ends at The step reaching the silicon nitride film. Thus, the semiconductor device shown in FIG. 1 can be finally obtained. Incidentally, the arrangement shown in FIG. 14 is inverted upside-down from that shown in FIG. 1 so that it may be easily understood. The exposed insulating film 3 has a remarkably excellent flatness and is arranged therebelow with the single crystal silicon thin film 4. As a result, this flat surface insulating film 3 can be easily subjected to a variety of additional treatments including at least the formation of electrodes, and the single crystal silicon thin film 4 can also be easily subjected, if desired, to an additional treatment.

As has been described hereinbefore, according to the present invention, the integrated circuit formed on the SOI substrate is transferred to the support substrate, and the tentative substrate portion of the SOI substrate is then removed so that the semiconductor device has its one face wired in advance and its other face exposed to the outside. This exposed face has a flat surface and is arranged just therebelow with the single crystal semiconductor thin film. Since the exposed face can be subjected to the additional treatment of forming electrodes or wiring, the semiconductor device according to the present invention can be given the double-side wiring structure to raise an effect that its packaging density is improved far better than the prior art. By dividing the wiring lines of the integrated circuit into upper and lower faces, the wiring density can be substantially doubled to miniaturize the integrated circuit. Alternatively, the thin film laminated layer formed with the integrated circuit is formed on its back with a wiring pattern and on its surface with an externally connecting pad electrode, thus raising an effect that the two surface and back can be efficiently exploited. Another effect is that the semiconductor device satisfying various applications can be remarkably easily manufactured by adding various electrodes to the exposed surface of the semiconductor device in accordance with the design specifications. For example, the semiconductor device substrate for driving the light valve is obtained by forming a transparent electrode for defining the pixel, for example. Moreover, the DRAM can be easily manufactured by forming a capacity electrode. By forming an additional gate electrode, furthermore, it is possible to manufacture a semiconductor device which is composed of transistor elements having an excellent ON/OFF ratio. In addition, a semiconductor device composed of transistor elements having a low offset current can be manufactured by making the added gate electrode of a shielding material.

In the structure of the semiconductor device according to the present invention, the single crystal semiconductor thin film is arranged just below the surface insulating film. As a result, an additional treatment can be applied through the surface insulating film to raise an effect that so-called "double-side processing" can be accomplished. For example, a MROM can be manufactured remarkably easily by doping the channel forming region of the transistor element selectively through the surface insulating film.

According to the present invention, the thin film laminated layer formed with the semiconductor integrated circuit is supported through the adhesive film by the support substrate. As a result, no integral and undividable relation resides unlike the prior art between the thin film laminated layer and its support substrate, thus raising an effect that the material for the support substrate can be suitably selected in accordance with the intended application or the like of the semiconductor device. In case the semiconductor device is used as the lithe valve driving substrate, for example, a transparent material such as quartz can be selected as the material for the support substrate. Alternatively, in case the semiconductor device is packaged in the IC card or the like, the sheet-shaped semiconductor device can be easily manufactured by increasing the thickness of the adhesive film to form the support substrate.

According to the present invention, a semiconductor device to be subjected to the double-side processing and wiring is manufactured by using transfer technology. As a result, there can be attained an effect that a semiconductor device of high performance and density can be obtained without any complicated processing. In particular, ordinary LSI manufacturing technology can be sufficiently exploited by applying the ordinary LSI manufacturing technology to the SOI substrate to form an integrated circuit and by transferring the integrated circuit to the support substrate. By thermally bonding and polishing a silicon wafer to form the single crystal semiconductor thin film on the surface of the SOI substrate, there is attained an effect that the semiconductor device can be manufactured using a substrate material which is excellent in uniformity of crystal orientation and in density of the lattice defect.

Figure 16:
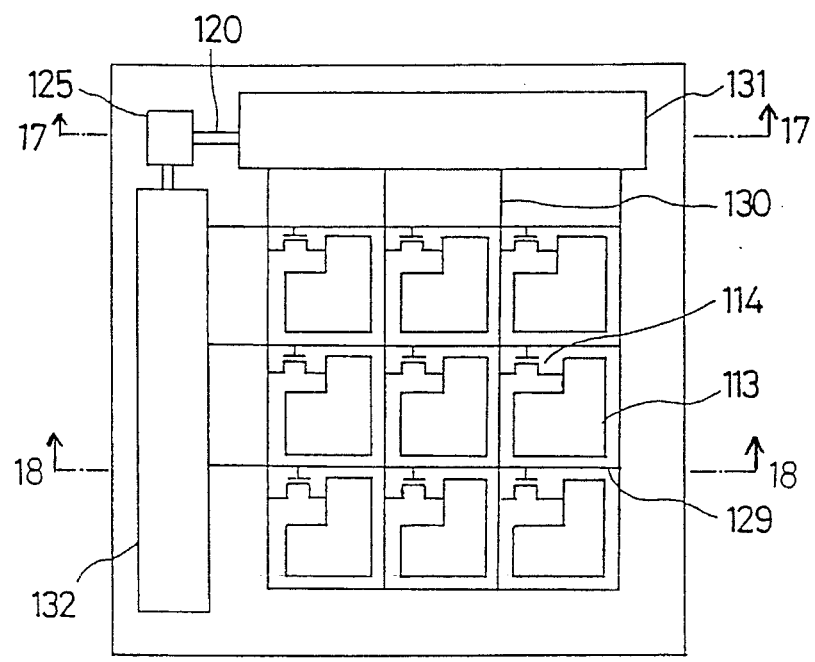
FIG. 16 shows an eleventh embodiment of the semiconductor device according to the present invention and is a top plan view showing a light valve substrate.

FIG. 16 is a top plan view showing a semiconductor device for a light valve device according to a eleventh embodiment of the present invention. Reference numeral 111 designates an insulating transparent thin film, which is arranged on its upper face with a plurality of pixel electrodes 113 in a matrix shape. The insulating transparent thin film is further formed, at its portions except the pixel electrodes 113, with a semiconductor single crystal thin film, which is formed with switch elements 114 adjacent to the individual pixel electrodes 113.

On the other hand, the grouped pixel electrodes 113 are surrounded by an X driver 131, a Y driver 132, a pad lead-out portion 125 and a wiring pattern 120 for connecting the foregoing elements. The switch element 114 is a field effect transistor, which has its drain electrode connected with a corresponding pixel electrode 113, its gate electrode connected with a scanning line 129, its source electrode connected with a signal line 130. Moreover, the scanning line 129 is connected with the Y driver 132, and the signal line 130 is connected with the X driver 131. These individual drivers are connected through the pad leadout portion 125 with a not-shown external circuit. The pad lead-out portion 125 extends, as will be described with reference to FIG. 17, to the lower face of the insulating transparent thin film, to which its surface is exposed.

At the uppermost portion of the thin film substrate thus far described, there is disposed a polarizing plate, which is omitted for convenient description.

Figure 17:
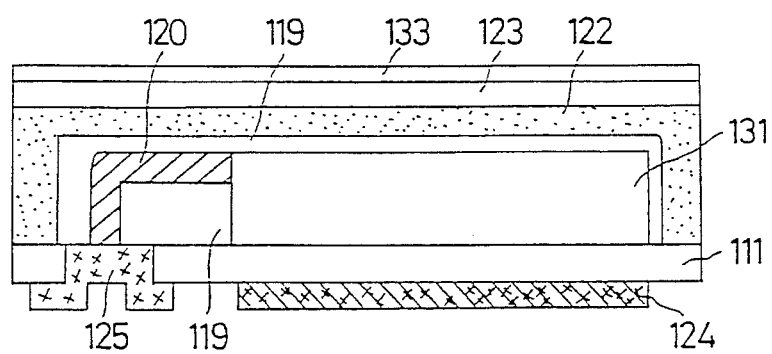
FIG. 17 is a section taken along line A—A' of FIG. 16.

FIG. 17 is a section taken along line A-A' of FIG. 16 showing the relations among the X driver 131, the wiring pattern 120, the shielding film and the pad lead-out portion 125. This pad lead-out portion 125 extends, as apparent from FIG. 17, through the insulating transparent thin film 111 from the upper to lower faces thereof and further from the lower portion to the outside while avoiding the pixel electrode portion. With the pad lead-out portion 125, there is connected an external signal line, through which signals are transferred to the individual drivers 131 and 132. The X driver 131 and the wiring pattern 120 are enclosed by an electric insulating passivation film 119, onto which a transparent electric insulating substrate 123 is fixed through an adhesive. A polarizing plate 133 is placed-on the transparent electric insulating substrate 123. The pad lead-out portion 125 has its surface exposed through the lower face of the insulating transparent thin film 111 to the outside, and a shielding film 124 is placed in a position opposite to the X driver 131.

Figure 18:
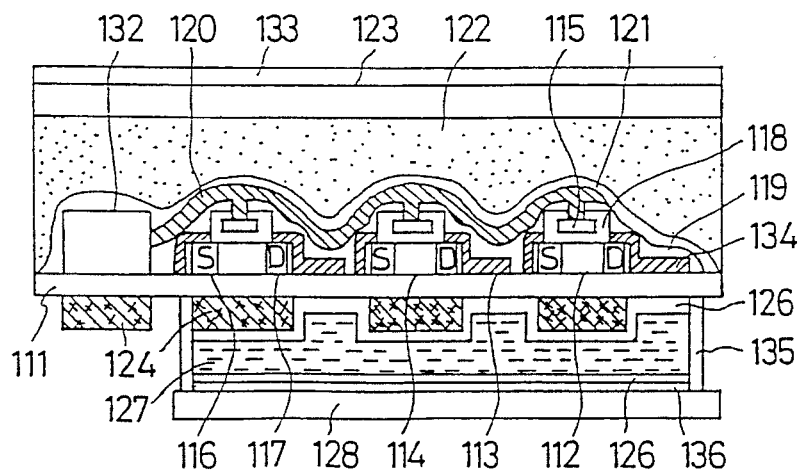
FIG. 18 is a section showing a light valve device using a semiconductor device using a substrate.

FIG. 18 is a section showing an embodiment, in which a light valve device is made of the semiconductor device of FIG. 17. An opposite substrate is disposed below the lower face of the insulating transparent thin film of FIG. 16 and in a position opposite to the grouped pixel electrodes at a gap. This gap is filled with a liquid crystal 127 and has its sides sealed with a resin 135. On the other hand, the aforementioned opposite substrate is composed of an orientation film 126, an equi-potential electrode 136 and a glass substrate 128.

This lithe valve device is cue along line B-B' of FIG. 16, hue the pixel electrode 113 is shown, for convenient description,in a reduced smaller scale than that of the switch element 114.

The pixel electrodes are formed by preparing a substrate, in which a single crystal thin film semiconductor layer is thermally bonded to the upper face of the insulating transparent thin film 111, by etching off a portion of the single crystal thin film semiconductor layer in a predetermined shape to expose it to the surface of the underlying insulating transparent thin film 111, and by forming the plural electrodes 113 in a matrix shape on the exposed surface. This means may be a generally used one.

The switch element forms, on a single crystal thin film semiconductor layer 112, an insulated gate field effect transistor which is composed of a gate electrode 115 and a pair of impurity-diffused regions, i.e., a source electrode 116 and a drain electrode 117. The drain electrode 117 is connected with the corresponding pixel electrode 113, and the gate electrode 115 is arranged over The channel forming region of The switch element 114 through an insulating film 118. Over the switch elements 114, there is formed through the insulating film 119 the wiring pattern 120 which is made of aluminum. This wiring pattern 120 is electrically connected with the source electrodes 116 of the switch elements 114 through contact holes formed in the insulating film 119 and further with the pad lead-out portion 125, as shogun in FIG. 17. The wiring pattern 120 is formed on its surface with the passivation film 121, on which the transparent electrically insulating substrate 123 is placed through the adhesive layer so that it may be prevented from being damaged due to a mechanical stress. The polarizing plate 133 is placed on the insulating substrate 123, as has been described with reference to FIG. 17.

Across the insulating Transparent thin film 111, the shielding film 124 is formed below the switch elements 114 and the Y driver 132 to prevent any undesired operation by light. The external signal is inputted from the not-shown pad lead-out portion so that the well-known liquid crystal panel is accomplished. Specifically, the gate electrodes 115 of the individual switch elements are connected with the scanning line 129 (as shown in FIG. 16) so that they are fed with scanning line signals by the Y driver 132 to control the ON/OFF of the individual switch elements in a linear order. Specifically, the image signals outputted from the X driver 131 are fed to the image electrodes 113 through the switch elements 114 which have their conductive states selected through the signal lines 130. As a result, the charges according to the magnitudes of the image signals are fed to and stored in the individual image electrodes 113. The liquid crystal layer 127 is excited by the stored charged so that it has its transparency changed to perform the light valve function. The switch elements 114 are non-conductive, when unselected, so that the image signals written before are latched in the image electrodes 113.

Since the switch elements 114 are shielded by the shielding film 124, no optical leakage current is generated, while the switch elements 114 are OFF, so that the charges stored in the pixel electrodes 113 will not leak. As a result, a stable light valve function is exhibited.

Since, moreover, the switch elements 114 are formed in the silicon single crystal thin film 112 having a remarkably high charge mobility, it is possible to construct a light valve device which has a high speed signal responsiveness. Furthermore, the circuit including the X driver 131 and the Y driver 132 can be formed on the common silicon thin film simultaneously with the switch elements 114, thus raising an effect that the manufacture process is simplified. Incidentally, the present embodiment has been described in connection with the lithe valve device formed with the polarizing plate 133. Nevertheless, the polarizing plate need not be formed if the liquid crystal used is exemplified by a polymer-dispersed liquid crystal, in which a liquid crystal is dispersed in a high-molecular material.

Figure 19A:
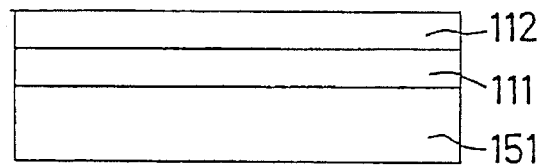
FIGS. 19(a) to 19(g) are diagrams for explaining the steps of manufacturing a semiconductor substrate for the light valve device and shows a twelfth embodiment of the present invention.

FIGS. 19(a) to 19(g) shows a twelfth embodiment of a process for fabricating a semiconductor device for a light valve device according to the present invention. First of all, a substrate shown in FIG. 19(a) is prepared. This substrate is formed by adhering the silicon single crystal thin film 112 to a silicon substrate 151 through the silicon dioxide layer 111 which is made of the insulating transparent thin film. The silicon substrate 151 is used to hold the mechanical strength when the single crystal thin film 112 has its face processed.

Figure 19B:
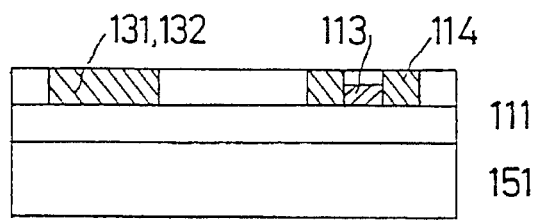

Next, the silicon single crystal thin film 112 is removed at the positions corresponding to the pixel electrodes by a well-known method. Then, the remaining single crystal thin film is formed by a well-known method with the X driver 131, the Y driver 132 and the switch elements 114 and is removed to cover the exposed portion of the silicon dioxide layer 111 with the transparent conductive layer thereby to form the pixel electrodes 113 (as shown in FIG. 19(b)). The not-shown passivation film and wiring pattern are formed over the pixel electrodes 113 thus formed and the drive elements 131, 132 and 114. FIG. 19(b) shows the state thus established.

Figure 19C:
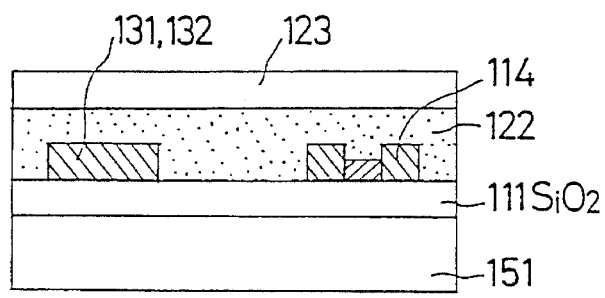

As shown in FIG. 19(c), moreover, an adhesive layer 122 represented by silicon dioxide is applied to them and is overlain by the glass substrate 123 with the polarizing plate.

Figure 19D:
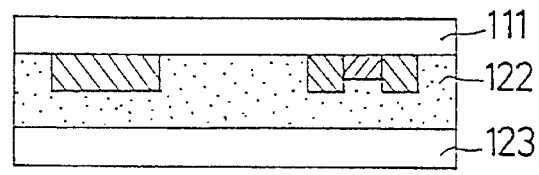
Figure 19E:
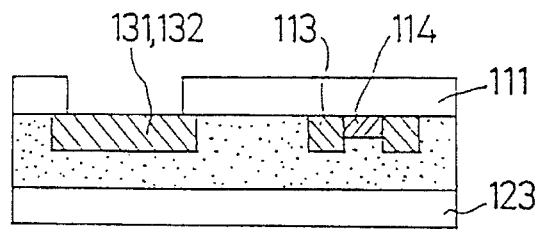
Figure 19F:
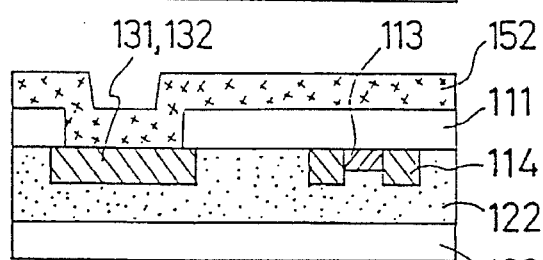

Next, this structure is inverted upside-down to place the silicon substrate 151 at the upper face, and this silicon substrate 151 is completely etched off to expose the silicon dioxide layer 111 to the outside. This state is shown in FIG. 19(d). In this state, as shown in FIG. 19(e), through holes for the pad lead-out portion 125 are bored in the predetermined positions by the etching process. With the through holes being open, a metal such as aluminum is deposited all over the surface in a shieldable thickness. This state is shown in FIG. 19(f).

Figure 19G:
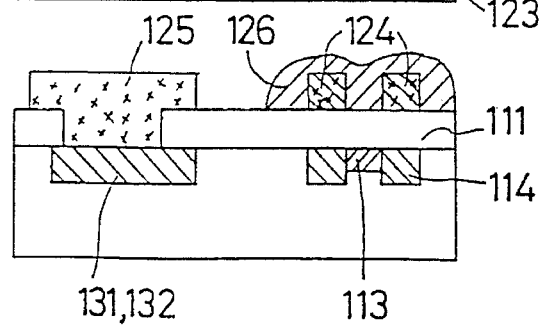

This metal-deposited face 152 is patterned remove the undesired portions corresponding to the pixel electrodes thereby to form the pad lead-out portion 125 and the shielding film 124 simultaneously. After this, an orientation layer is formed in the portions corresponding to the pixel portions. The completed state is shown in FIG. 19(g).

Figure 20:
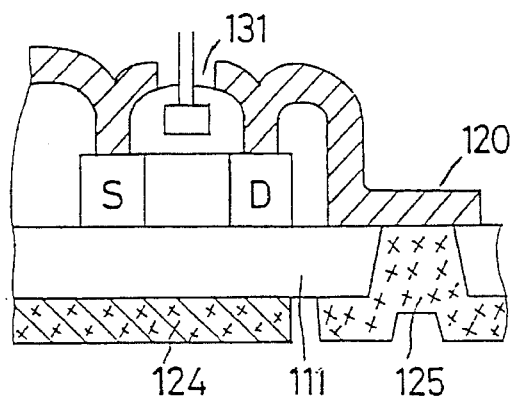
FIG. 20 is a diagram for explaining a pad lead-out portion of the semiconductor substrate for the light valve device of the present invention.

FIG. 20 is a detailed section for explaining the connection relation between the pad lead-out portion 125 and the wiring pattern 120. As shown, the pad lead-out portion 125 is connected through the silicon dioxide layer 111 from the upper to lower faces thereof with the wiring pattern 120 of the transistor constituting the driver 131 (or 132).

As has been described hereinbefore, according to the present embodiment, the orientation film for forming the liquid crystal layer and orienting said liquid crystal can be formed on the flat surface because the switch elements and the pixel electrodes are buried in the adhesive layer 122 and nor exposed to the liquid crystal layer 127, even if the pixel electrodes and the switch elements have different thicknesses so that their undulations cannot be avoided. As a result, the display image of the light valve device, if formed, can be prevented from having a defect such as an irregular contrast.

Since, moreover, the pad lead-out portion 125 is exposed to the insulating transparent thin film at the side to be formed with the orientation film, no new space need be prepared for the pad lead-out portion 125, thus raising advantages that the size can be reduced and that the shielding layer and the pad lead-out portion 125 can be simultaneously formed.

Since, furthermore, the switch elements 114 are formed in the silicon single crystal thin film 112 having a remarkably high charge mobility, there can be attained an effect that it is possible to construct a light valve device having high-speed signal responsiveness.

FIGS. 21(a) to 21(d) are explanatory diagrams showing a thirteenth embodiment according to the present invention.

FIG. 21 (a) is a top plan view showing a substrate 161 to be used in the present invention, and FIG. 21 (b) is a schematic section showing the structure of one chip manufactured from the substrate 161. As shown, this substrate 161 is formed into a wafer shape having a diameter of 6 inches, for example. The substrate 161 has a five-layer structure which is composed of a support layer 162 made of quartz, for example, a single crystal semiconductor layer 163 formed over the support layer 162 and made of silicon, for example, an adhesive layer 164 formed between the support layer 162 and the single crystal semiconductor layer 163 and made of an organic adhesive, glass having a low melting point or the like, an insulating layer 165 over the single crystal semiconductor layer 163, and a light shielding layer 166 formed over the insulating layer 165. In the substrate 161, the miniaturized semiconductor manufacturing technology is applied to the single crystal semiconductor layer 163 so that the driver circuit and the pixel electrode of an active matrix display system are formed for each chip section, for example.

Figure 21A:
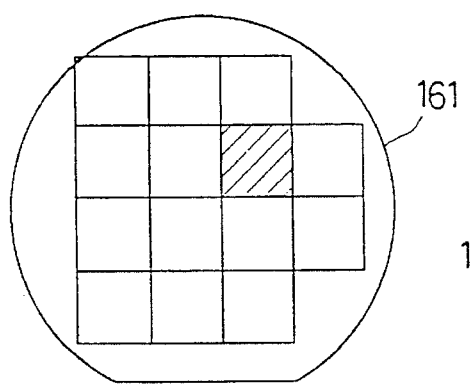
FIGS. 21(a) to 21(d) show a thirteenth embodiment according to the present invention and explain a process for constructing a semiconductor device as a light valve device.
Figure 21B:
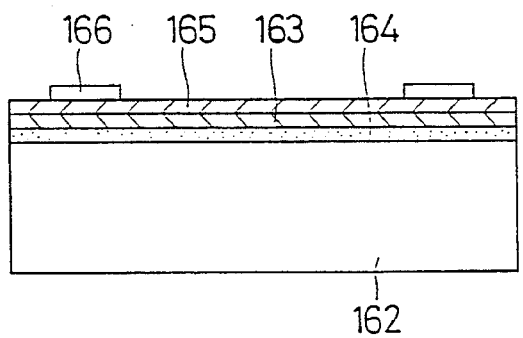
Figure 21C:
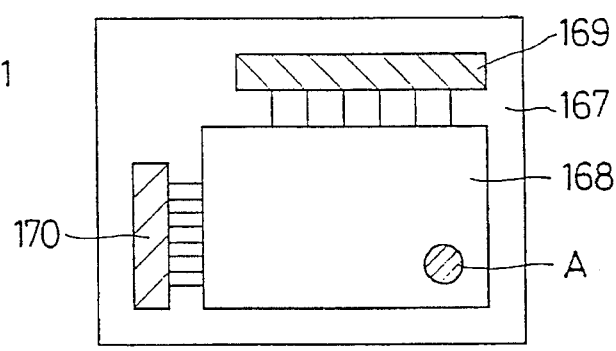

FIG. 21(c) is an enlarged top plan view showing an integrated circuit chip obtained from the substrate 161. As shown, the integrated circuit chip 167 has a length of 1.5 cm along one side, for example, so that it is far more miniaturized than that of the active matrix display system of the prior art. The integrated circuit chip 167 is composed of: a pixel region 168 which is formed with fine pixel electrodes arranged in a matrix shape and insulated gate field effect transistors corresponding to the individual pixel electrodes: an X driver region 169 a driver circuit, i.e., the X driver for feeding the image signal to each transistor: and a scanning circuit, i.e., a Y driver region 170 for scanning the individual transistors in a linear sequence. Since the single crystal thin film having a far higher charge mobility and less crystal defects than those of the amorphous thin film or the polycrystal thin film is used according to the present invention, the X and Y drivers requiring a high-speed responsiveness can be formed on a face shared with the pixel region.

Figure 21D:
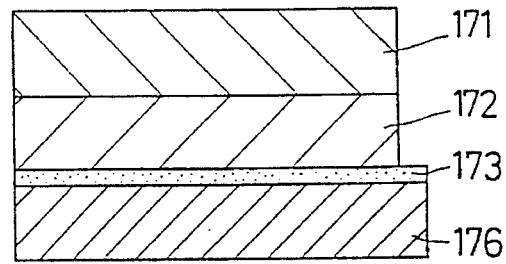

FIG. 21(d) is a section showing a microminiature and highly dense active matrix type light valve device which is assembled by using the aforementioned integrated circuit chip 167. As shown, the light valve device is composed of an opposed substrate 171 which is arranged opposite to the integrated circuit chip 167 at a predetermined gap, and a liquid crystal layer 172 filling up said gap and made of an electrooptical substance layer. Incidentally, the integrated circuit chip 167 has its surface covered with an orientation film 173 for orienting the liquid crystal molecules contained in the liquid crystal layer 172. The individual pixel electrodes formed in the pixel region 168 of the integrated circuit chip 167 are selectively excited, when the corresponding transistor elements are turned on, to act upon and control the optical transparency of the liquid crystal layer 172 so that they function as the light valve. Since the individual pixel electrodes have a size of about 10 μm, it is possible to provide a remarkably fine active matrix liquid crystal light valve device.

Figure 22A:
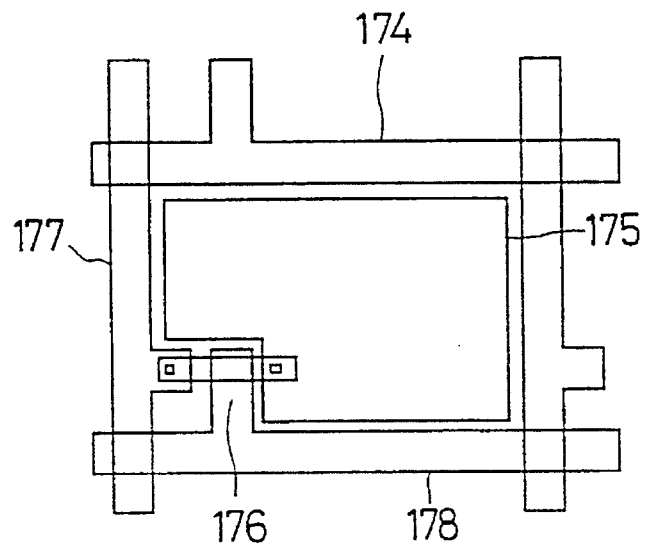
FIGS. 22(a) and 22(b) are an enlarged top plan view and a section showing a pixel region showing a light valve device according to the present invention.

FIG. 22(a) is a top plan view showing the A portion of the pixel region 168 of FIG. 21(c) in an enlarged scale and shows one pixel. As shown, this pixel 174 is composed of a pixel electrode 175, a transistor 176 for exciting the pixel electrode in response to a signal, a signal line 177 for feeding the signal to said transistor 176, and a scanning line 178 for scanning said transistor. The signal line 177 is connected with the X driver, and the scanning line 178 is connected with the Y driver.

Figure 22B:
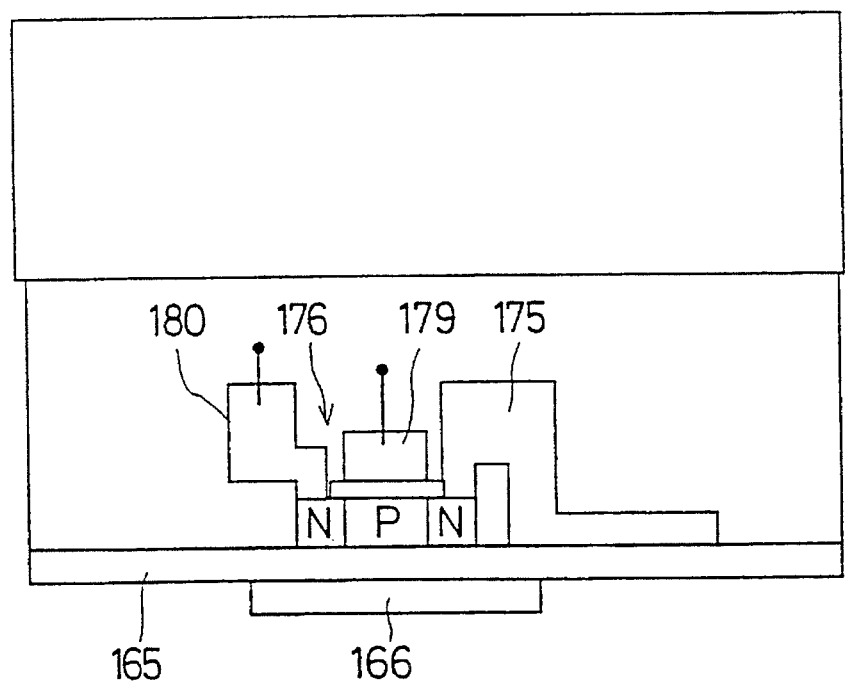

FIG. 22(b) is a schematic section showing the same one pixel 174. The transistor 176 is composed of a drain region and a source region formed in the single crystal thin film layer 163, and a gate electrode 179 formed over the channel region through a gate insulating film. In short, the transistor 176 is of the insulated gate field effect type. The gate electrode 179 is formed of a portion of the scanning line 178, the pixel electrode 175 is connected with the drain region, and a source electrode 180 is connected with the source region. This source electrode 180 forms pare of the signal line 177. The shielding film 166 shields incident light coming from the shielding from the transistor 176 to prevent optical leakage current which might be established between the source region and drain region of the transistor 176. By holding the shielding film 166 at a constant potential, moreover, the potential between the liquid crystal drive electrodes 175 of the adjacent pixels is shielded, and any stray light between the pixel electrodes is shielded. Since, furthermore, the shielding film 166 and the liquid crystal drive electrode 175 have planarly overlap portions through the insulating film 165, there can be established a capacitance for holding the voltage which is written in the pixel electrodes 165.

FIGS. 23(a) to 23(e) show a fourteenth embodiment of a process for manufacturing the semiconductor device, especially its pixel portion for the light valve device of the present invention.

Figure 23A:
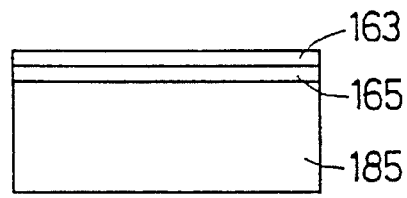
FIGS. 23(a) to 23(e) show a fourteenth embodiment according to the present invention and are process diagrams showing steps of manufacturing a pixel portion of a light valve device semiconductor device.

As shown in FIG. 23(a), the single crystal semiconductor layer 163 is formed over a single crystal semiconductor substrate 185 through the insulating film 165. Specifically, for example, the single crystal silicon substrate and the substrate silicon can be insulated with the silicon oxide, while leaving the single crystal silicon layer on the surface of the silicon substrate, by doping the silicon substrate with oxygen ions and then annealing it. According to another example, this insulation can be achieved by adhering the silicon single crystal substrate having the oxide film on its surface and the silicon single crystal substrate and by removing one silicon substrate up to the thickness of the thin film layer.

Figure 23B:
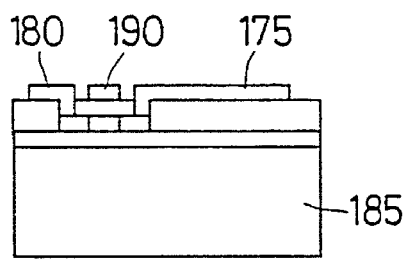

Next, as shown in FIG. 23(b), the pixel electrodes 175, the driver circuit, the control circuit and so on are formed in the single crystal semiconductor layer 163 by the ordinary semiconductor miniaturization.

Figure 23C:
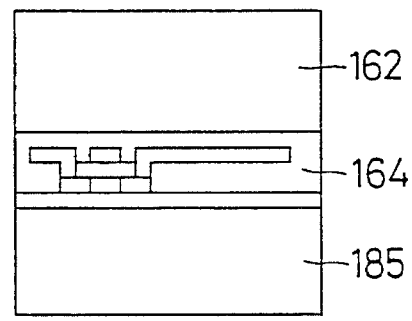

As shown in FIG. 23(c), moreover, the single crystal semiconductor substrate 185 and the support layer 162 are adhered to each other through the adhesive layer 164. The support layer 162 is made of an insulator such as glass or quartz.

Figure 23D:
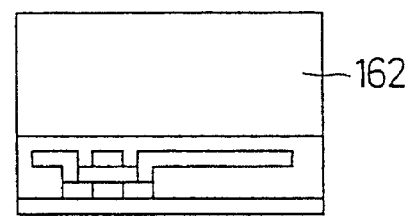

FIG. 23(d) is a diagram showing the state, in which the semiconductor substrate is removed while leaving the insulating layer 165 and the single crystal semiconductor layer 163 of the single crystal semiconductor substrate 185. The removing method used is exemplified by the polishing or etching method. At this time, the insulating layer can be used as the etching stop layer or for detecting the final point of the polishing operation.

Figure 23E:
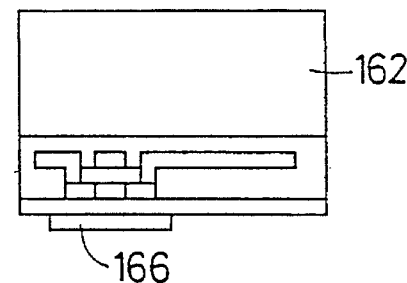

Finally, as shown in FIG. 23(e), the optically sensitive element portion such as the transistor formed in the single crystal semiconductor layer 163 is covered with the light shielding layer 166 which is made of a metal film.

Figure 24:
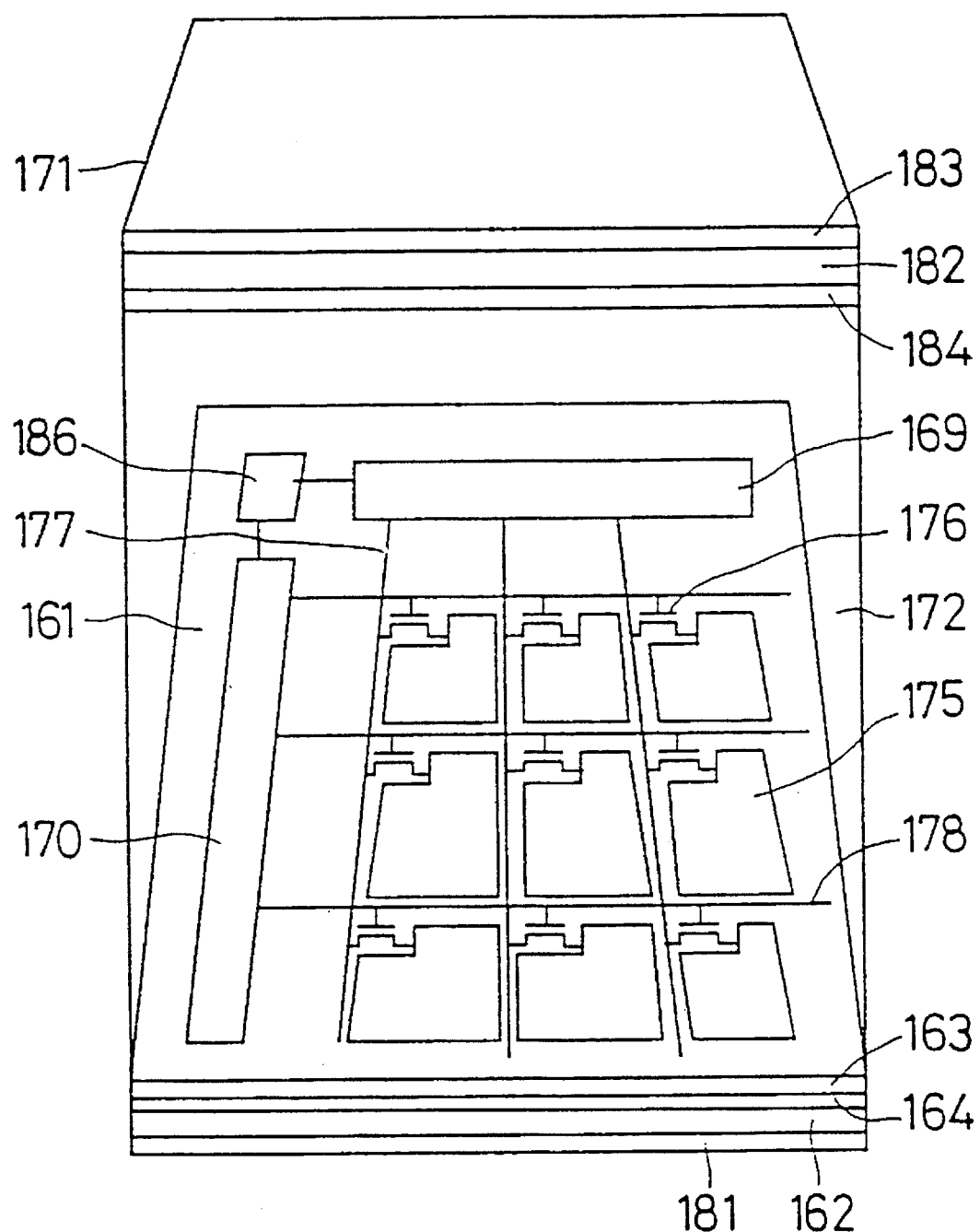
FIG. 24 shows a fifteenth embodiment according to the present invention and is an exploded perspective view for explaining a light valve device.

FIG. 24 is a schematic exploded perspective view showing a fifteenth embodiment of the light valve device according to the present invention. As shown, the light valve device is composed of the drive substrate 161, the opposite substrate 171 opposed to said drive substrate, and the liquid crystal layer 172 of an electrooptical substance layer arranged between said drive substrate 161 and said opposite substrate 171.

The drive substrate 161 is formed with pixel electrodes or drive electrodes for defining the pixels 175, and a driver circuit for exciting the drive electrodes in response to a predetermined signal. The drive substrate 161 is given a five-layer structure which is composed of the support layer 162 made of quartz, the single crystal silicon semiconductor film layer 163, the adhesive layer 164, the insulating layer 165 and the light shielding layer 166. In addition, a polarizing plate 181 is adhered to the back of the quartz carrier layer 162. Moreover, the driver is made of an integrated circuit which is formed in the single crystal silicon semiconductor film layer 163. This integrated circuit includes a plurality of field effect type insulated gate transistors 176 arranged in a matrix shape. The transistor 176 has its drain electrode connected with the corresponding pixel electrode 175, its gate electrode connected with the scanning line 178, and its source electrode connected with the signal line 177. Said integrated circuit further includes the X driver 169 and is connected with the arrayed signal lines 177.

The integrated circuit further includes the Y driver 170 and is connected with the arrayed scanning lines 178. These X driver 169 and Y driver 170 are connected with an image signal processor 186 which is also formed in the single crystal semiconductor film layer 163 so that they are driven through the processor 186 in response to the image signals coming from the outside. On the other hand, the opposite substrate 171 is composed of a glass substrate 182, a polarizing plate 183 formed on the outer face of the glass substrate 182, and an opposite or common electrode 184 formed on the inner face of the glass substrate 182. The light shielding layer 166 covers that portion such as the transistor or the PN junction of the semiconductor film layer 163, which has its characteristics changed by the influences of an incident light, through the insulating layer 165.

Next, the operations of the aforementioned embodiment will be described in detail with reference to FIG. 24. The individual transistor elements 176 have their gate electrodes connected with the scanning lines 178 so that they are fed with the scanning signals by the Y driver 170 to control their ON/OFF in a linear sequence. The display signal outputted from the X driver 169 is fed through the signal line 177 to the selected transistor 176 in the conductive state.

The display signal thus fed is transmitted to the corresponding pixel electrode 175 so that it excites the pixel electrode and acts upon the liquid crystal layer 172 to establish substantially total transparency.

At an unselected time, on the other hand, the transistor elements 176 are turned off to hold the display signals written in the pixel electrodes as the charges. Incidentally, the liquid crystal layer 172 has a high specific resistance and normally operates as a capacity. The ON/OFF current ratio is used to express the switching performances of those drive transistor elements 176. The current ratio necessary for the liquid crystal operation is easily determined from the write time and the latch time. If the display signals are TV signals, for example, 90% or more of the display signals for one scanning period of about 60 μ sec have to be written.

On the other hand, 90% or more of the charges have to be latched for one field period of about 16 msecs. As a result, the current ratio required has five figures or more. Since, at this time, the drive transistor elements are formed over the single crystal silicon semiconductor thin film layer 163 having a remarkably high charge mobility, six or more figures of the ON/OFF ratio can be retained. Thus, it is possible to provide an active matrix type light valve device having a remarkably high-speed signal responsiveness. By making use of the high mobility of the single crystal thin film, moreover, especially the peripheral circuits 169 and 170 can be formed over the common silicon single crystal semiconductor thin film. Since, moreover, the light shielding layer 166 is formed, the light valve device can operate without being influenced by an intense incident light.

As has been described hereinbefore, according to the present invention, the light valve device is formed by using the integrated circuit chip substrate which is obtained by forming the pixel electrodes and the driver circuits integrally in the semiconductor single crystal thin film formed over the carrier layer by using the semiconductor miniaturizing technology. As a result, there can be attained an effect that it is possible to provide a light valve device having a remarkably high pixel density. Since the integrated circuit technology can be used for the single crystal thin film layer, there can be attained an effect that it is possible to easily add the circuit having various functions equivalent to those of the LSI. A further effect is that not only the switching transistors and the driver circuits can be simultaneously built in using the single crystal thin film. Even with an intense incident light, furthermore, normal operation can be attained by the shielding film. Furthermore, there can be attained a remarkable effect that the image quality of the light valve device can be highly improved for preventing the crosstalk between the pixels by establishing a capacity between the shielding film and the pixel electrodes, by elongating the latch time of the signals written in the pixels, and by shielding the electric field between the pixels.

Figure 25A:
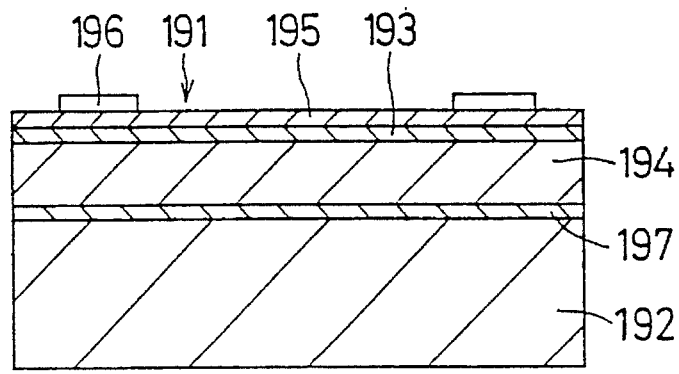
FIGS. 25(a) and 25(b) are sections showing a sixteenth embodiment according to the present invention, in which the semiconductor device is constructed as a light valve device.
Figure 25B:
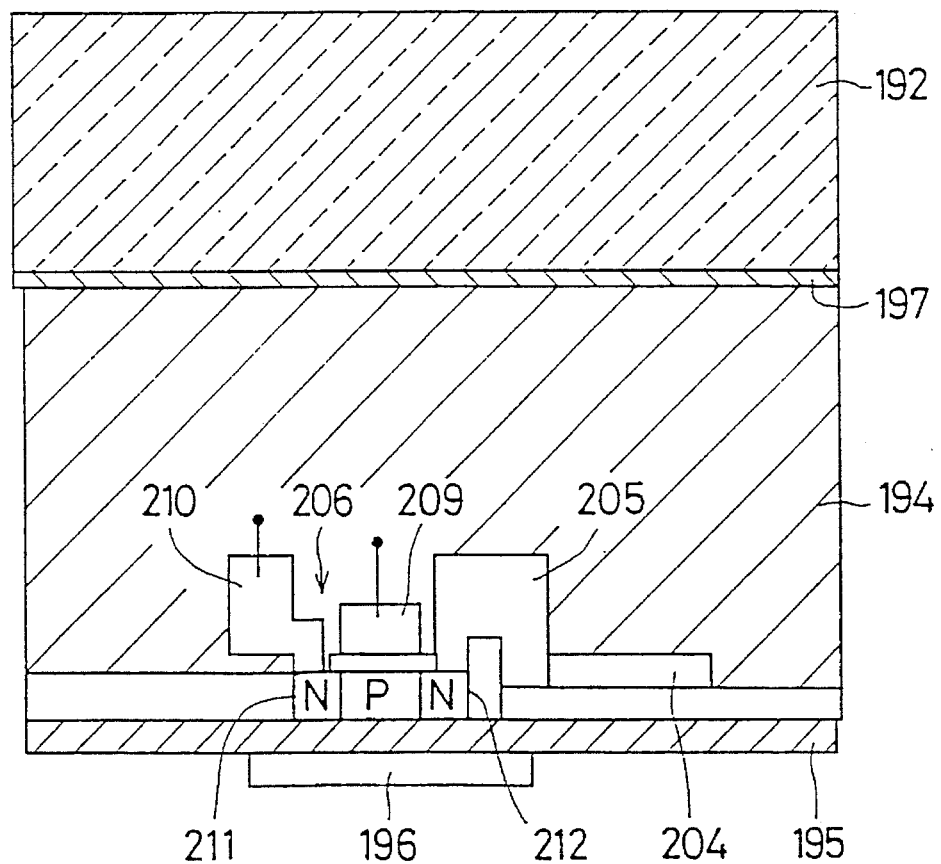

FIGS. 25(a) and 25(b) show a sixteenth embodiment of the light valve device using a semiconductor device according to the present invention and are diagrams for explaining the sectional structure of the light valve device. In the present embodiment, the thin semiconductor film over the thin insulating film, from which the support substrate of the semiconductor device, is used as one substrate of the light valve device.

FIG. 25(a) is a section showing the light valve device. A substrate 191 is made of a thin film which is composed of a single crystal semiconductor thin film 193, an insulating film 195, and a light shielding film 196 formed over the insulating film 195. Between said substrate 191 and a support substrate 192 formed with a transparent electrode 197, there is formed an electrooptical substance layer 194. This electrooptical material layer 194 can be exemplified by a liquid crystal or a polymer liquid crystal, in which a liquid crystal is dispersed in a polymer material. The single crystal semiconductor thin film 193 is formed thereover for the individual sections with the driver circuits and the pixel electrodes of an active matrix display system by applying the miniature semiconductor manufacturing technology.

FIG. 25(b) is a schematic section showing one pixel. As shown, a pixel 204 is composed of a pixel electrode 205, a transistor 106 for exciting the pixel electrode in response to a signal, a signal line for feeding the signal to said transistor 206, and a scanning line for scanning said Transistor, although the latter two components are not shown. On the other hand, the signal line is connected with the X driver, and the scanning line is connected with the Y driver. The transistor 206 is composed of a source region 211 and a drain region 212 formed in the single crystal thin film layer 193, and a gate electrode 209 formed over the channel region through the gate insulating film. In short, the transistor 206 is of the insulated gate field effect type. The gate electrode 209 is formed of a portion of the scanning line, and the pixel electrode 204 is connected with the drain region 212 whereas a source electrode 210 is connected with the source region 211. The source electrode 210 forms part of the signal line. The light shielding film 196 shields an incident light coming to the transistor 206 to prevent an optical leakage current being established between the source region 211 and drain region 212 of the transistor 206. Moreover, the light shielding film 196 shields stray light from being transmitted between the pixel electrodes. Furthermore, the shielding light film 196 and the liquid crystal drive electrode 205 have planarly overlap portions through the insulating film 195 to establish a capacitance, which can hold the voltage written in the pixel electrode 204.

FIGS. 26(a) to 26(e) show a process for manufacturing the light valve device using the semiconductor device according to a seventeenth embodiment of the present invention.

Figure 26A:
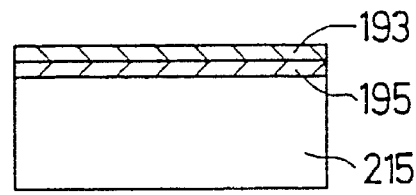
FIGS. 26(a) to 26(e) show a seventeenth embodiment according to the present invention and are process diagrams showing a process for manufacturing a light valve device.

As shown in FIG. 26(a), the insulating film 195 and the single crystal thin film 193 are formed over a single crystal semiconductor substrate 215. Specifically, a single crystal silicon substrate is annealed, for example, after it has been doped with oxygen ions, so that the silicon substrate and the substrate silicon can be insulated with the silicon oxide while leaving the single crystal silicon layer on the surface of the silicon substrate. Alternatively, one silicon substrate can be removed while leaving the thickness of the thin film layer by adhering the silicon single crystal substrate formed on its surface with an oxide film and the silicon single crystal substrate.

Figure 26B:
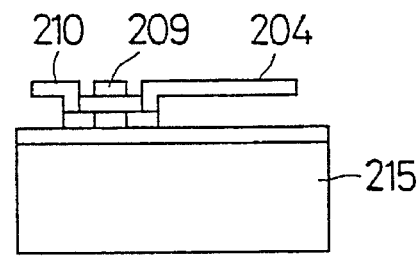

FIG. 26(b) shows an ordinary semiconductor miniaturization, by which the pixel electrode, the driver circuit and the control circuit are formed over the single crystal semiconductor layer 193.

Figure 26C:
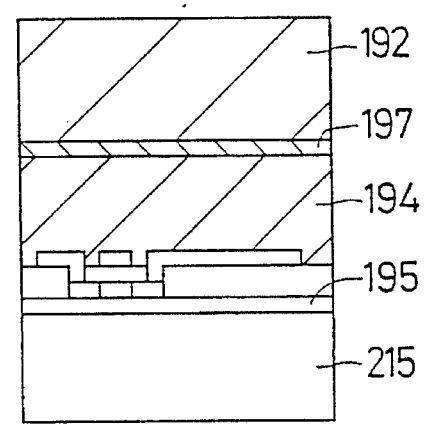
Figure 26D:
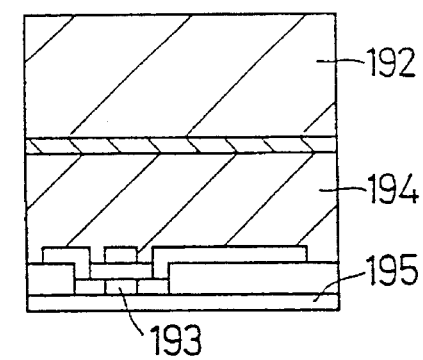

In FIG. 26(c), the single crystal semiconductor substrate 215 and the support substrate 192 are adhered through the polymer liquid crystal type liquid crystal layer 194. The support substrate 192 is made of an insulator such as glass or quartz.

In FIG. 28(d), the single crystal semiconductor substrate 215 is removed while leaving its insulating layer 195 and single crystal semiconductor layer 193. The removing method to be used is exemplified by the polishing or etching method. At this time, the insulating layer is one for stopping the etching or for detecting the terminal point of the polishing.

Figure 26E:
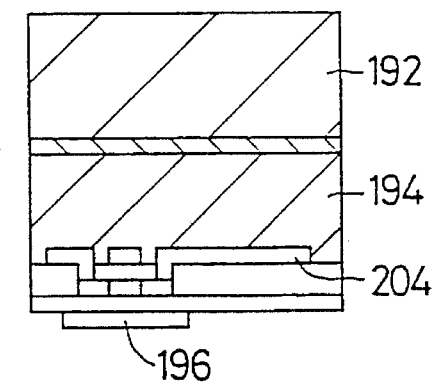

In FIG. 26(e), the shielding film 196 is formed to cover at least the channel region of the field effect transistor over the insulating film 195.

The light valve device can be achieved by the steps thus far described.

Figure 27:
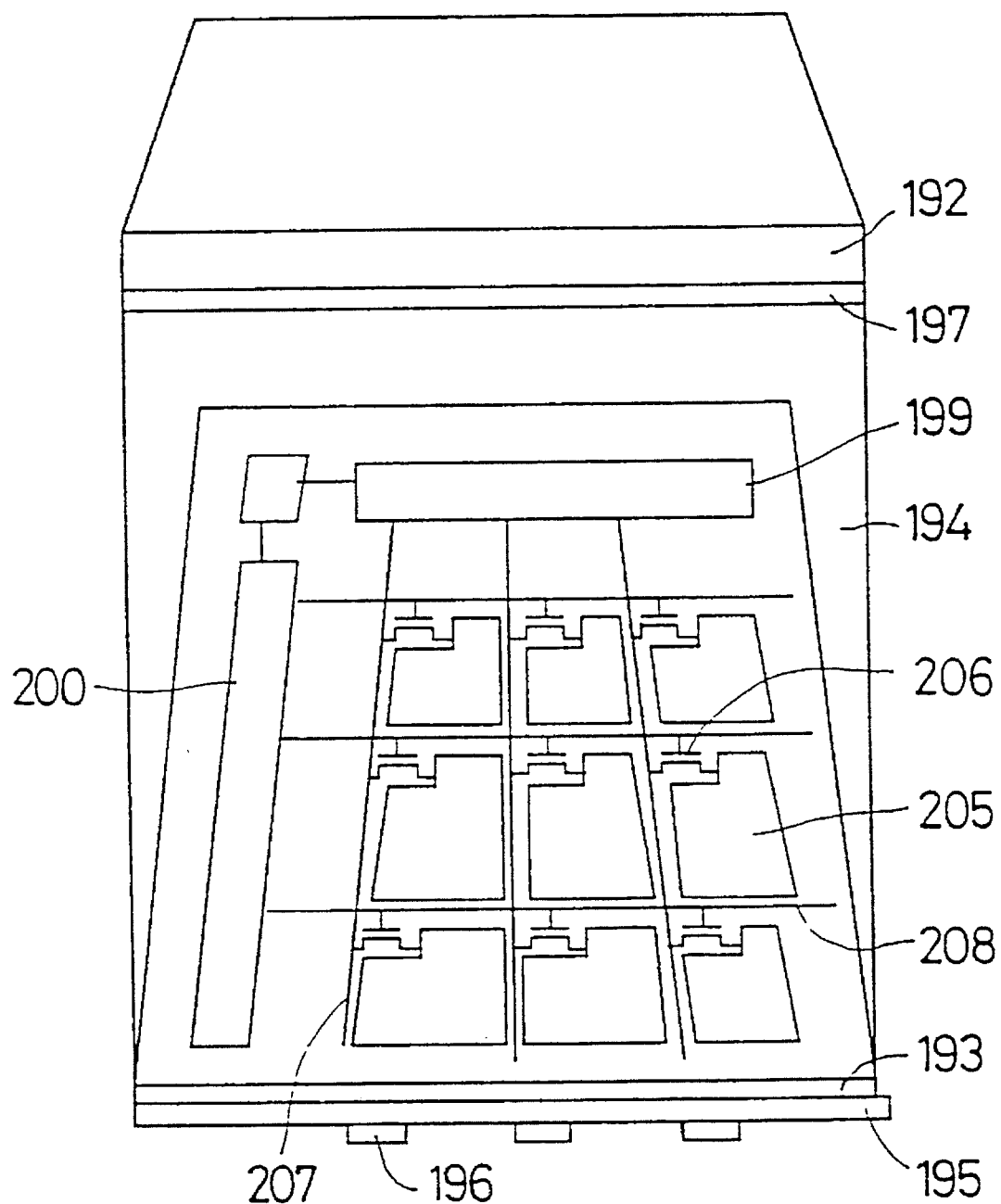
FIG. 27 shows an eighteenth embodiment according to the present invention and is an exploded perspective view for explaining a light valve device.

FIG. 27 is a schematic exploded perspective view showing a eighteenth embodiment of the light valve device using the semiconductor device according to the present invention.

As shown, the light valve device is composed of the silicon semiconductor film layer 193, the glass support substrate 192 opposed To said semiconductor film layer 193, and the polymer liquid crystal type liquid crystal layer 194 arranged between said semiconductor film layer 193 and the support substrate 192. The silicon semiconductor film layer 193 is formed with the pixel electrode or drive electrode 205 for defining a pixel, and the driver circuit for exciting the drive electrode 205 in response to a predetermined signal. The support substrate 192 is formed on its surface with the common electrode 197 made of a transparent conductive film. Moreover, the driver circuit is made of an integrated circuit which is formed in the single crystal silicon semiconductor film layer 193. The integrated circuit contains a plurality of field effect type insulated gate transistors 206 which are arranged in a matrix shape. Each transistor 206 has its source electrode connected with the corresponding electrode 205, its gate electrode connected with a scanning line 208, and its drain electrode connected with a signal line 207. Said integrated circuit further includes an X driver 199 connected with the column signal lines 207, and a Y driver 200 connected with the row scanning lines 208.

The light shielding layer 196 covers the transistors or PN junctions of the semiconductor film layer 193, whose characteristics are changed under the influences of an incident light, through the insulating layer 195. Incidentally, the drive method of the present light valve device is similar to that which has been described in the fifteenth embodiment of the present invention.

In the light valve device described above according to the present invention, if a color filter is formed to correspond to each pixel electrode at the substrate or opposite substrate side formed with the semiconductor thin film layer, a color image can naturally be displayed.

As has been described hereinbefore, according to the present invention, the integrated circuit chip substrate, which is obtained by forming the pixel electrodes and the driver circuits integrally on the semiconductor single crystal thin film formed over the carrier layer by the use of the semiconductor miniaturizing technology, is used to form the light valve device. As a result, there arises an effect that it is possible to provide a light valve device having a remarkably high pixel density. Moreover, another effect is to provide a remarkably small-sized light valve device because it can be made as small as the integrated circuit chip. A further effect is that a circuit having a variety of functions as high as those of the LSI can be easily added because the integrated circuit technology can be applied to the single crystal thin film layer. A further effect is that not only the switching transistors but also the driver circuits can be simultaneously packaged by using the single crystal thin film. The light shielding film ensures the normal operation even if the incident light is intense. Furthermore, the light shielding film has a capacity between itself and the pixel electrodes to elongate the holding time of the signals written in the pixels and shields the electric field between the pixels to prevent the crosstalk between the pixels, thus raising a prominent effect that the image quality of the light valve device can be highly improved.

Figure 28:
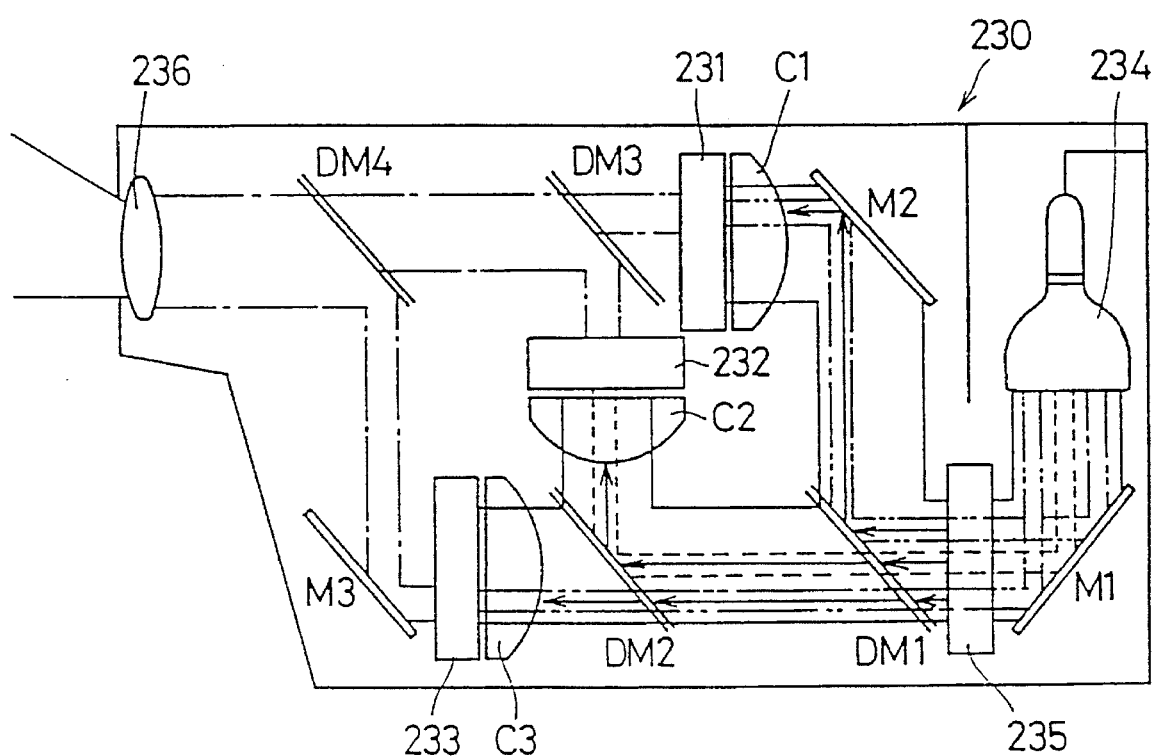
FIG. 28 shows an ninteenth embodiment according to the present invention and is an section for explaining an image projection system using a light valve device.

FIG. 28 is a schematic enlarged section showing a video projector using the light valve device according to ninteenth embodiment of the present invention. The video projector 230 has three active matrix transparent light valve devices 231 to 233 built therein. A white light emitted from a white light source lamp 234 is reflected by a reflecting mirror M1 and then resolved into red, blue and green lights by a trichromatic resolving filter 235. The red light is selectively reflected by a dichroic mirror DM1 and is then reflected by a reflecting mirror M2. After this, the red light is condensed by a condenser lens C1 until it is guided into the first light valve device 231. The red light is modulated by the light valve device 231 in accordance with a video signal and is transmitted through dichroic mirrors DM3 and DM4. After this, the red light is magnified and projected to the front by a magnifying lens 236. Likewise, the blue light having passed the dichroic mirror DM1 is selectively reflected by a dichroic mirror DM2 and is condensed by a condenser lens C2 until it is guided into the second light valve device 232. Here, the blue light is modulated in accordance with the video signal and is guided through the dichroic mirrors DM3 and DM4 into a common magnifying lens 236. Moreover, the green light is transmitted through the dichroic mirrors DM1 and DM2 and is condensed by a condenser lens C3 until it is introduced into the third light valve device 233. Here, the green light is modulated in accordance with the video signal and is reflected toward the magnifying lens 236 by a reflecting mirror M3 and a dichroic mirror DM4. Thus, those primaries individually modulated by the three light valve devices are finally synthesized by the magnifying lens 236 so that they are projected in a magnified two-dimensional image on the front. The light valve devices used have a size of an order of cm so that the various optical parts and the white light lamp can be accordingly small-sized. As a result, the overall shape and size of the video projector 230 can be made far smaller than those of the prior art.

What is claimed is:

1. A process for manufacturing a semiconductor device, comprising:

a first step of forming an SOI substrate by depositing an insulating film of silicon dioxide on a surface of a temporary silicon substrate, thermally bonding a semiconductor substrate of single crystal silicon on a surface of the insulating film, and polishing the semiconductor substrate to form a single crystal semiconductor thin film;

a second step of forming a semiconductor integrated circuit in the single crystal semiconductor thin film;

a third step of fixedly adhering a support substrate in face-to-face relation to a surface of the semiconductor integrated circuit opposite to the temporary substrate;

a fourth step of removing the temporary substrate to expose a surface of the insulating film to the outside; and a fifth step of subjecting the exposed surface of the insulating film to a treatment including at least forming an electrode.

2. A semiconductor device manufacturing process according to claim 1; wherein in the third step the support substrate is fixedly adhered in face-to-face relation to the semiconductor integrated circuit by an adhesive comprised mainly of silicon dioxide.

3. A semiconductor device manufacturing process according to claim 1; wherein in the third step an adhesive is deposited on the surface of the semiconductor integrated circuit and is solidified to form the support substrate having a single-layer structure.

4. A semiconductor device manufacturing process according to claim 1; wherein the first step further comprises depositing a silicon nitride layer as a surfacing treatment on the temporary substrate before depositing the insulating film of silicon dioxide.

5. A semiconductor device manufacturing process according to claim 4; wherein in the third step the support substrate is fixedly adhered in face-to-face relation to the semiconductor integrated circuit by an adhesive comprised mainly of silicon dioxide.

6. A semiconductor device manufacturing process according to claim 4; wherein in the third step an adhesive is deposited on the surface of the semiconductor integrated circuit and is solidified to form the support substrate having a single-layer structure.

7. A semiconductor device manufacturing process according to claim 4; wherein the temporary substrate is removed by an etching process; and wherein the silicon nitride layer is used as an etching stopper.

8. A process for manufacturing a semiconductor device, comprising: depositing a layer of silicon dioxide on a surface of a first substrate; thermally bonding a second substrate of single crystal silicon on the silicon dioxide layer; subjecting the second substrate to processing to form a single crystal semiconductor thin film; forming a semiconductor integrated circuit in the single crystal semiconductor thin film; depositing an adhesive on a surface of the semiconductor integrated circuit and solidifying the adhesive to form a support substrate having a single-layer structure; removing the first substrate to expose a surface of the silicon dioxide layer; and subjecting the exposed surface of the silicon dioxide layer to a treatment including at least forming an electrode.

9. A semiconductor device manufacturing process according to claim 8; wherein the adhesive forming the support substrate is comprised mainly of silicon dioxide.

10. A semiconductor device manufacturing process according to claim 8; wherein the second substrate is subjected to a polishing treatment to form the single crystal semiconductor thin film.

11. A semiconductor device manufacturing process according to claim 8; wherein the second substrate is subjected to an etching treatment to form the single crystal semiconductor thin film.

12. A process for manufacturing a semiconductor device, comprising: depositing a layer of silicon nitride on a surface of a first substrate; depositing a layer of silicon dioxide on the silicon nitride layer; thermally bonding a second substrate of single crystal silicon on the silicon dioxide layer; subjecting the second substrate to processing to form a single crystal semiconductor thin film; forming a semiconductor integrated circuit in the single crystal semiconductor thin film; fixedly adhering a support substrate in face-to-face relation to a surface of the semiconductor integrated circuit opposite the first substrate; etching the first substrate using the silicon nitride layer as an etch stopper to expose a surface of the silicon dioxide layer; and subjecting the exposed surface of the silicon dioxide layer to a treatment including at least forming an electrode.

13. A semiconductor device manufacturing process according to claim 12; wherein the support substrate is fixedly adhered to the semiconductor integrated circuit by an adhesive comprised mainly of silicon dioxide.

* * * * *